US010580625B2

(12) United States Patent
Maschwitz

(10) Patent No.: US 10,580,625 B2
(45) Date of Patent: *Mar. 3, 2020

(54) PLASMA SOURCE AND METHODS FOR DEPOSITING THIN FILM COATINGS USING PLASMA ENHANCED CHEMICAL VAPOR DEPOSITION

(71) Applicants: AGC Flat Glass North America, Inc., Alpharetta, GA (US); Asahi Glass Co., Ltd., Tokyo (JP); AGC Glass Europe, Louvain-la-Neuve (BE)

(72) Inventor: Peter Maschwitz, Sebastopol, CA (US)

(73) Assignees: AGC FLAT GLASS NORTH AMERICA, INC., Alpharetta, GA (US); ASAHI GLASS CO., LTD., Tokyo (JP); AGC GLASS EUROPE, Louvain-la Neuve (BE)

( * ) Notice: Subject to any disclaimer, the term of this patent is extended or adjusted under 35 U.S.C. 154(b) by 889 days.

This patent is subject to a terminal disclaimer.

(21) Appl. No.: 14/486,779

(22) Filed: Sep. 15, 2014

(65) Prior Publication Data

US 2015/0004330 A1 Jan. 1, 2015

Related U.S. Application Data

(60) Continuation of application No. 14/148,606, filed on Jan. 6, 2014, which is a division of application No.
(Continued)

(51) Int. Cl.
*C23C 16/50* (2006.01)
*H01J 37/32* (2006.01)
(Continued)

(52) U.S. Cl.
CPC ...... *H01J 37/32596* (2013.01); *C03C 17/245* (2013.01); *C03C 17/2456* (2013.01);
(Continued)

(58) Field of Classification Search
CPC ........................................ C23C 16/50–16/517
(Continued)

(56) References Cited

U.S. PATENT DOCUMENTS 2,920,235 A 1/1960 Bell et al.
3,253,180 A 5/1966 Huber
(Continued)

FOREIGN PATENT DOCUMENTS

CN 1598049 A 3/2005
CN 1831190 A 9/2006
(Continued)

OTHER PUBLICATIONS

European Search Report, issued in EP 09805431.5 dated Apr. 8, 2016, 6 pages.
(Continued)

*Primary Examiner* — Elizabeth A Burkhart
(74) *Attorney, Agent, or Firm* — Rothwell, Figg, Ernst & Manbeck, P.C.

(57) ABSTRACT

The present invention provides novel plasma sources useful in the thin film coating arts and methods of using the same. More specifically, the present invention provides novel linear and two dimensional plasma sources that produce linear and two dimensional plasmas, respectively, that are useful for plasma-enhanced chemical vapor deposition. The present invention also provides methods of making thin film coatings and methods of increasing the coating efficiencies of such methods.

26 Claims, 11 Drawing Sheets

Related U.S. Application Data

12/535,447, filed on Aug. 4, 2009, now Pat. No. 8,652,586.

(60) Provisional application No. 61/137,839, filed on Aug. 4, 2008.

(51) Int. Cl.

| | | |
|---|---|---|
| C23C 16/40 | (2006.01) | |
| C23C 16/455 | (2006.01) | |
| C23C 16/503 | (2006.01) | |
| H05H 1/24 | (2006.01) | |
| C03C 17/245 | (2006.01) | |
| C23C 16/513 | (2006.01) | |
| H05H 1/42 | (2006.01) | |
| H05H 1/46 | (2006.01) | |

(52) U.S. Cl.
CPC ...... *C23C 16/402* (2013.01); *C23C 16/45517* (2013.01); *C23C 16/503* (2013.01); *C23C 16/513* (2013.01); *H01J 37/32036* (2013.01); *H01J 37/3266* (2013.01); *H01J 37/32568* (2013.01); *H01J 37/32724* (2013.01); *H05H 1/24* (2013.01); *H05H 1/42* (2013.01); *H05H 1/46* (2013.01); *C03C 2217/213* (2013.01); *C03C 2218/153* (2013.01); *H01J 2237/3321* (2013.01); *H01J 2237/3328* (2013.01); *H05H 2001/466* (2013.01)

(58) Field of Classification Search
USPC .......... 427/569, 571; 118/715, 723 E, 723 R
See application file for complete search history.

(56) References Cited

U.S. PATENT DOCUMENTS

| | | |
|---|---|---|
| 3,381,157 A | 4/1968 | Ferreira |
| 3,813,549 A | 5/1974 | Di Stefano et al. |
| 4,017,808 A | 4/1977 | Fein et al. |
| 4,196,233 A | 4/1980 | Bitzer et al. |
| 4,419,203 A | 12/1983 | Harper et al. |
| 4,422,014 A | 12/1983 | Glaser |
| 4,702,784 A | 10/1987 | Naoumidis et al. |
| 4,916,356 A | 4/1990 | Ahern et al. |
| 5,028,791 A | 7/1991 | Koshiishi et al. |
| 5,070,811 A | 12/1991 | Feuerstein et al. |
| 5,113,790 A | 5/1992 | Geisler et al. |
| 5,185,132 A | 2/1993 | Horiike et al. |
| 5,286,534 A | 2/1994 | Kohler et al. |
| 5,302,422 A | 4/1994 | Nowak et al. |
| 5,369,337 A | 11/1994 | Yanagi et al. |
| 5,399,254 A | 3/1995 | Geisler et al. |
| 5,437,778 A | 8/1995 | Hedgcoth |
| 5,581,155 A | 12/1996 | Morozov et al. |
| 5,593,539 A | 1/1997 | Kubota et al. |
| 5,609,690 A | 3/1997 | Watanabe et al. |
| 5,614,248 A | 3/1997 | Schiller et al. |
| 5,614,273 A | 3/1997 | Goedicke et al. |
| 5,627,435 A | 5/1997 | Jansen et al. |
| 5,846,608 A | 12/1998 | Neumann et al. |
| 5,874,807 A | 2/1999 | Neger et al. |
| 5,908,602 A | 6/1999 | Bardos et al. |
| 5,939,829 A | 8/1999 | Schoenbach et al. |
| 5,985,378 A | 11/1999 | Paquet |
| 6,082,293 A | 7/2000 | Kawashima |
| 6,140,773 A | 10/2000 | Anders et al. |
| 6,146,462 A | 11/2000 | Yializis et al. |
| 6,174,450 B1 | 1/2001 | Patrick et al. |
| 6,177,148 B1 | 1/2001 | Walther et al. |
| 6,293,222 B1 | 9/2001 | Paquet |
| 6,388,381 B2 | 5/2002 | Anders |
| 6,444,945 B1 * | 9/2002 | Maschwitz ........... C23C 14/243 |
| | | 118/723 E |
| 6,489,854 B1 | 12/2002 | Chen |
| 6,508,911 B1 | 1/2003 | Han et al. |
| 6,528,947 B1 | 3/2003 | Chen et al. |
| 6,750,600 B2 | 6/2004 | Kaufman et al. |
| 6,768,079 B2 | 7/2004 | Kosakai |
| 6,800,336 B1 | 10/2004 | Förnsel et al. |
| 6,849,854 B2 | 2/2005 | Sainty |
| 6,899,054 B1 | 5/2005 | Bárdos et al. |
| 6,902,814 B2 | 6/2005 | Takahashi et al. |
| 6,924,223 B2 | 8/2005 | Yamasaki et al. |
| 7,241,360 B2 | 7/2007 | Shabalin et al. |
| 7,307,383 B2 | 12/2007 | Takeuchi et al. |
| 7,322,313 B2 | 1/2008 | Mayumi et al. |
| 7,327,089 B2 | 2/2008 | Madocks |
| 7,411,352 B2 | 8/2008 | Madocks |
| 7,411,353 B1 | 8/2008 | Rutberg et al. |
| 7,543,546 B2 | 6/2009 | Shibata et al. |
| 7,649,316 B2 | 1/2010 | Rueger et al. |
| 7,976,907 B2 | 7/2011 | Hofrichter et al. |
| 8,143,788 B2 | 3/2012 | Hofer et al. |
| 8,328,982 B1 | 12/2012 | Babayan et al. |
| 8,356,575 B2 | 1/2013 | Sasaki et al. |
| 8,476,587 B2 | 7/2013 | Jones et al. |
| 8,652,586 B2 * | 2/2014 | Maschwitz ........... C23C 16/402 |
| | | 118/718 |
| 8,697,197 B2 | 4/2014 | Savas et al. |
| 8,926,920 B2 | 1/2015 | Morfill et al. |
| 9,478,401 B2 | 10/2016 | Maschwitz |
| 9,533,914 B2 | 1/2017 | Mahieu et al. |
| 9,704,692 B2 | 7/2017 | Leeser |
| 9,721,765 B2 | 8/2017 | Chambers et al. |
| 9,735,020 B2 | 8/2017 | Hudson |
| 10,068,743 B2 | 9/2018 | Goerbing |
| 2002/0000779 A1 | 1/2002 | Anders |
| 2002/0194833 A1 | 12/2002 | Gallimore et al. |
| 2003/0113479 A1 | 6/2003 | Fukuda et al. |
| 2004/0033385 A1 | 2/2004 | Kaushal et al. |
| 2005/0016456 A1 | 1/2005 | Taguchi et al. |
| 2005/0016458 A1 | 1/2005 | Zhang et al. |
| 2005/0035731 A1 | 2/2005 | Secheresse et al. |
| 2005/0040037 A1 | 2/2005 | Walton et al. |
| 2005/0106094 A1 | 5/2005 | Kondo |
| 2005/0115933 A1 | 6/2005 | Kong et al. |
| 2005/0208215 A1 | 9/2005 | Eguchi et al. |
| 2005/0221022 A1 | 10/2005 | Wang et al. |
| 2006/0030134 A1 | 2/2006 | Kim et al. |
| 2006/0177599 A1 | 8/2006 | Madocks |
| 2006/0208649 A1 | 9/2006 | Rueger et al. |
| 2007/0002515 A1 | 1/2007 | Hino et al. |
| 2007/0017636 A1 | 1/2007 | Goto et al. |
| 2007/0123041 A1 | 5/2007 | Anzai et al. |
| 2007/0144621 A1 | 6/2007 | Farmer et al. |
| 2007/0163440 A1 | 7/2007 | Kim et al. |
| 2008/0073557 A1 | 3/2008 | German et al. |
| 2008/0106202 A1 | 5/2008 | Du et al. |
| 2009/0004836 A1 | 1/2009 | Singh et al. |
| 2009/0032393 A1 | 2/2009 | Madocks |
| 2009/0071403 A1 | 3/2009 | Choi et al. |
| 2009/0071406 A1 | 3/2009 | Choi et al. |
| 2009/0183771 A1 | 7/2009 | Sunnomiya et al. |
| 2009/0218212 A1 | 9/2009 | Denpoh et al. |
| 2010/0028238 A1 | 2/2010 | Maschwitz |
| 2010/0044579 A1 | 2/2010 | Holmes et al. |
| 2010/0126779 A1 | 5/2010 | Corbett et al. |
| 2010/0186671 A1 | 7/2010 | Hein et al. |
| 2010/0225234 A1 | 9/2010 | Tseng et al. |
| 2011/0005682 A1 | 1/2011 | Savas et al. |
| 2011/0006040 A1 | 1/2011 | Savas et al. |
| 2011/0135843 A1 | 6/2011 | Niira et al. |
| 2011/0192348 A1 | 8/2011 | Tseng et al. |
| 2011/0212624 A1 | 9/2011 | Hudson |
| 2011/0226611 A1 | 9/2011 | Madocks |
| 2011/0297532 A1 | 12/2011 | Chakraborty et al. |
| 2012/0019946 A1 | 1/2012 | Aravind |
| 2012/0164353 A1 | 6/2012 | Madocks |
| 2012/0225218 A1 | 9/2012 | Savas et al. |
| 2012/0258555 A1 | 10/2012 | Holland et al. |
| 2012/0289054 A1 | 11/2012 | Holland et al. |
| 2012/0313517 A1 | 12/2012 | Rueger et al. |

(56) References Cited

U.S. PATENT DOCUMENTS

| | | | |
|---|---|---|---|
| 2013/0112670 | A1 | 5/2013 | Yokogawa et al. |
| 2013/0333618 | A1 | 12/2013 | Cox |
| 2013/0337657 | A1 | 12/2013 | Savas et al. |
| 2014/0099451 | A1 | 4/2014 | Mahieu et al. |
| 2014/0272388 | A1 | 9/2014 | Knight et al. |
| 2014/0272459 | A1 | 9/2014 | Daugherty et al. |
| 2014/0354119 | A1 | 12/2014 | Shishido et al. |
| 2014/0354149 | A1 | 12/2014 | Morgner et al. |
| 2015/0152542 | A1 | 6/2015 | Deppisch et al. |
| 2015/0235814 | A1 | 8/2015 | Kawahara et al. |
| 2016/0024657 | A1 | 1/2016 | Sakamoto et al. |
| 2017/0004955 | A1 | 1/2017 | Leeser |
| 2017/0040145 | A1 | 2/2017 | Brandon et al. |
| 2017/0178869 | A1 | 6/2017 | Chambers et al. |
| 2018/0025892 | A1 | 1/2018 | Biquet et al. |

FOREIGN PATENT DOCUMENTS

| | | | |
|---|---|---|---|
| CN | 1860587 | A | 11/2006 |
| CN | 102099505 | A | 6/2011 |
| CN | 102497721 | A | 6/2012 |
| CN | 102677022 | A | 9/2012 |
| CN | 102771192 | A | 11/2012 |
| CN | 102816987 | A | 12/2012 |
| CN | 103042317 | A | 4/2013 |
| CN | 103493602 | A | 1/2014 |
| CN | 103534383 | A | 1/2014 |
| CN | 103632911 | A | 3/2014 |
| CN | 105427014 | A | 3/2016 |
| DE | 199 02 146 | A1 | 8/2000 |
| EA | 201391765 | A1 | 4/2014 |
| EP | 0727508 | A1 | 8/1996 |
| EP | 0 886 310 | A2 | 12/1998 |
| EP | 0881865 | A2 | 12/1998 |
| EP | 1035561 | A2 | 9/2000 |
| EP | 1 913 624 | B1 | 4/2008 |
| GB | 1 257 015 | | 12/1971 |
| JP | S-59228338 | A | 12/1984 |
| JP | S61-238962 | A | 10/1986 |
| JP | 61251021 | A | 11/1986 |
| JP | S63-297560 | A | 12/1988 |
| JP | H4-180557 | A | 6/1992 |
| JP | H4-358076 | A | 12/1992 |
| JP | H5-226258 | A | 9/1993 |
| JP | H7-73994 | A | 3/1995 |
| JP | H11-335868 | A | 12/1999 |
| JP | 3061288 | B2 | 4/2000 |
| JP | 2001035692 | A | 2/2001 |
| JP | 2002-121670 | A | 4/2002 |
| JP | 2002-143795 | A | 5/2002 |
| JP | 2003-193239 | A | 7/2003 |
| JP | 2004-533703 | A | 11/2004 |
| JP | 2005-005065 | A | 1/2005 |
| JP | 2005-5065 | A | 1/2005 |
| JP | 2005-068444 | A | 3/2005 |
| JP | 2005-68444 | A | 3/2005 |
| JP | 2005-243892 | A | 9/2005 |
| JP | 2005-302681 | A | 10/2005 |
| JP | 2006-164683 | A | 6/2006 |
| JP | 2007-026781 | A | 2/2007 |
| JP | 2007-280641 | A | 10/2007 |
| JP | 2008-4814 | A | 1/2008 |
| JP | 2008-112580 | A | 5/2008 |
| JP | 2009-502554 | A | 1/2009 |
| JP | 2009-534797 | A | 9/2009 |
| JP | 2010-021140 | A | 1/2010 |
| JP | 2010530115 | A | 9/2010 |
| JP | 2011-530155 | A | 12/2011 |
| JP | 2013-520836 | A | 6/2013 |
| JP | 2013-0251367 | A | 12/2013 |
| JP | 2014-518947 | A | 8/2014 |
| KR | 2008-0024693 | A | 3/2008 |
| KR | 10-1179650 | B1 | 9/2012 |
| RU | 2239532 | C1 | 11/2004 |
| TW | 200304343 | A | 9/2003 |
| TW | I233144 | B | 5/2005 |
| TW | I235408 | B | 7/2005 |
| TW | I244673 | B | 12/2005 |
| TW | 200714742 | | 4/2007 |
| TW | I294257 | B | 3/2008 |
| WO | 96/16531 | A1 | 5/1996 |
| WO | 02079815 | A2 | 10/2002 |
| WO | 2005-047180 | A1 | 5/2005 |
| WO | 2007/015779 | A2 | 2/2007 |
| WO | 2012160145 | A1 | 11/2012 |
| WO | 2015/022621 | A1 | 2/2015 |
| WO | 2016/089424 | A1 | 6/2016 |
| WO | 2016/089427 | A1 | 6/2016 |
| WO | 2016/104076 | A1 | 6/2016 |

OTHER PUBLICATIONS

United Arab Emirates Examination Report, issued UAE/P/0119/2011 dated Apr. 10, 2016, 17 pages.
M. Mildner et al., "13.56 MHz hollow cathode jet matrix plasma source for large area surface coating," Surface and Coatings Technology, vol. 112, pp. 366-372, XP000983344 (1999).
D. Child et al., "Enhanced Hollow Cathode Plasma Source for Low Pressure Electron-Beam Deposition Processes", 2014 Society of Vacuum Coaters 505/856-7188, ISSN 0737-5921, May 2014, 6 pages.
B. Buchholtz, "Physics of Ion Beam Sources" 7 pages.
M. Proschek et al., "The effect of phase difference between powered electrodes on RF plasmas", Plasma Sources Sci. Technol. 14, 2005, 407-411.
Extended European Search Report, issued in EP 09805431.5 dated Aug. 4, 2014, 16 pages.
Taiwanese Office Action, issued in TW 10521126650, dated Sep. 9, 2016, 10 pages.
Taiwanese Office Action, issued in TW 10521126670, dated Sep. 9, 2016, 9 pages.
Non-final Office Action, issued in U.S. Appl. No. 14/942,737, dated Sep. 22, 2016, 53 pages.
Korean Office Action, issued in KR 10-2011-7005282 dated Aug. 22, 2015, including English language translation, 21 pages.
Chinese Office Action, issued in CN 2009801394506 on Dec. 29, 2014, including English language translation, 9 pages.
Garcia-Cespedes, et al., "Carbon nanotubes grown by asymmetric bipolar pulsed-DC PECVD", Diamond and Related Materials, vol. 16, pp. 1131-1135, Jan. 25, 2007.
PCT International Search Report and Written Opinion, issued in PCT/US 09/52679 dated Sep. 28, 2009, 12 pages.
L. Bardos, et al., "Linear Arc Discharge (LAD)—Radio Frequency Hollow Cathode Plasma Source for Low Pressure Processing," 1996 Society of Vacuum Coaters, 39th Annual Technical Conference Proceedings (1996), ISSN 0737-5921, pp. 128-132.
L. Bardos, et al., "PECVD by Hollow Cathodes," 1998 Society of Vacuum Coaters, 41st Annual Technical Conference Proceedings (1998), ISSN 0737-5921, pp. 315-320.
A. Belkind, et al., "Linear Plasma Source for Reactive Etching and Surface Modification," 1995 Society of Vacuum Coaters, 38th Annual Technical Conference Proceedings (1995), ISSN 0737-5921, pp. 432-436.
A. E. Delahoy, et al., "Transparent and semitransparent conducting film deposition by reactive-environment, hollow cathode sputtering," American Vacuum Society, J. Vac. Sci, Technol. A 23(4), Jul./Aug. 2005, pp. 1215-1220.
J. Madocks, et al., "Large Area Plasma Enhanced Chemical Vapor Deposition of SiO2 on Glass and Plastic," 2007 Society of Vacuum Coaters, 50th Annual Technical Conference Proceedings (2007), ISSN 0737-5921, pp. 233-238.
A.A. Pradhan, et al., "High Deposition Rate Reactive Sputtering with Hollow Cathode," 2002 Society of Vacuum Coaters, 45th Annual Technical Conference Proceedings (2002), ISSN 0737-5921, pp. 96-100.
C. M. Horwitz, "Silicon deposition in diode and hollow-cathode systems," 1989 American Vacuum Society, J. Vac. Sci. Technol. B 7 (3), May/Jun. 1989, pp. 443-449.

(56) References Cited

OTHER PUBLICATIONS

S.K. Deb, "The Role of Vacuum Coatings in Cost-Effective Photovoltaic Technologies," Society of Vacuum Coaters, 51st Annual Technical Conference Proceedings, Apr. 19-24, 2008, ISSN 0737-5921, pp. 101-106.
Japanese Office Action issued in JP 2011-522159 dated Jun. 25, 2013, including English language translation, 8 pages.
Argentine Office Action issued in AR 072911 A1, dated Jun. 11, 2013, 4 pages.
Eurasian Office Action issued in E 201100298 dated Mar. 16, 2013, 2 pages.
Philippine Office Action issued in PH 1/2011/500255 dated Jul. 16, 2013, 1 page.
Japanese Office Action issued in JP 2011-522159 dated Mar. 18, 2014, including English language translation, 8 pages.
Taiwanese Office Action, issued in TW 105103045, dated Dec. 30, 2016, including English language translation, 7 pages.
Chinese Office Action, issued in CN 201510505370.5 dated Nov. 28, 2016, including English language translation, 22 pages.
International Search Report and Written Opinion, issued in PCT/US2016/061134 dated Jan. 9, 2017, 24 pages.
International Search Report and Written Opinion, issued in PCT/US2016/060979 dated Jan. 9, 2017, 16 pages.
International Search Report and Written Opinion, issued in PCT/US2014/068919 dated Feb. 24, 2015, 13 pages.
International Search Report and Written Opinion, issued in PCT/US14/68858 dated Mar. 5, 2015, 12 pages.
Taiwanese Office Action, issued in TW 098126292 dated Mar. 23, 2015, including English language translation, 41 pages.
Japanese Office Action, issued in JP 2015-134085 dated Aug. 23, 2016, including English language translation, 9 pages.
Japanese Office Action, issued in JP 2015-134098 dated Aug. 30, 2016, including English language translation, 10 pages.
Japanese Office Action, issued in JP 2015-134106 dated Aug. 30, 2016, including English language translation, 10 pages.
Japanese Office Action, issued in JP 2015-134112 dated Aug. 2, 2016, including English language translation, 5 pages.
Japanese Office Action, issued in JP 2015-134116 dated Aug. 30, 2016, including English language translation, 10 pages.
Chinese Office Action, issued in CN 201410641340.2 dated Jun. 2, 2016, including English language translation, 11 pages.
Chinese Office Action, issued in CN 201510505383.2 dated May 17, 2017, including English language translation, 24 pages.
Chinese Office Action, issued in CN 201510505381.3 dated Jun. 5, 2017, including English language translation, 19 pages.
Chinese Office Action, issued in CN 201510505370.5 dated Jul. 21, 2017, including English language translation, 23 pages.
Japanese Office Action, issued in JP 2015-134112 dated Jul. 4, 2017, including English language translation, 5 pages.
Japanese Office Action, issued in JP 2015-134116 dated Mar. 28, 2017, including English language translation, 9 pages.
Non-final Office Action, issued in U.S. Appl. No. 14/148,606, dated Apr. 6, 2017, 36 pages.
Non-final Office Action, issued in U.S. Appl. No. 14/975,286, dated Apr. 7, 2017, 61 pages.
Non-final Office Action, issued in U.S. Appl. No. 14/975,415, dated Apr. 14, 2017, 69 pages.
Japanese Office Action, issued in JP 2015-134098 dated Jan. 10, 2017, including English language translation, 11 pages.
Indian First Examination Report issued in IN 357/MUMNP/2011 dated Aug. 21, 2017, including English language translation, 10 pages.
Non-final Office Action, issued in U.S. Appl. No. 15/645,774, dated Aug. 28, 2017, 58 pages.
Final Office Action, issued in U.S. Appl. No. 14/486,726, dated May 17, 2017, 38 pages.
Notification issued in Eurasian Patent Application No. 201400544 dated Dec. 7, 2017, 4 pages.
Office Action issued in U.S. Appl. No. 14/975,286 dated Oct. 23, 2017, 17 pages.

Notification of Reasons for Rejection issued in Japanese Application No. 2015-134116 dated Oct. 24, 2017, along with English translation, 9 pages.
Office Action issued in U.S. Appl. No. 14/486,726 dated Oct. 6, 2017, 15 pages.
Office Action issued in U.S. Appl. No. 14/148,606 dated Oct. 10, 2017, 18 pages.
Office Action issued in U.S. Appl. No. 14/975,415 dated Oct. 19, 2017, 17 pages.
Office Action issued for Chinese Patent Application No. 201510505383.2 dated Feb. 1, 2018, along with English translation (4 pages).
Office Action issued for Chinese Patent Application No. 201510505381.3, dated Feb. 1, 2018, along with the corresponding English translation (15 pages).
Office Action issued for Chinese Patent Application No. 201510505370.5, dated Feb. 5, 2018, along with the corresponding English translation (23 pages).
Office Action issued for U.S. Appl. No. 15/645,774 dated Mar. 9, 2018 (25 pages).
Office Action issued in U.S. Appl. No. 14/148,606 dated Apr. 5, 2018 (18 pages).
Communication issued in European Patent Application No. 09805431.5 dated Apr. 12, 2018 (10 pages).
Office Action issued for U.S. Appl. No. 14/975,415 dated May 4, 2018, 18 pages.
Office Action issued for Japanese Patent Application No. 2017-093637 dated May 29, 2018, along with English translation, 10 pages.
Office Action issued for U.S. Appl. No. 14/486,726 dated Jun. 22, 2018, 48 pages.
Office Action issued for U.S. Appl. No. 14/975,286 dated Jun. 28, 2018, 44 pages.
Office Action issued for U.S. Appl. No. 15/645,774 dated Jul. 12, 2018, 63 pages.
Examination Report, in corresponding Philippine Application No. 1/2015/500540, dated May 8, 2018, 2 pages.
Extended European Search Report dated Jul. 3, 2018, issued in European Patent Application No. 14907243.1, 10 pages.
Extended European Search Report dated Jul. 16, 2018, issued in European Patent Application No. 14907576.4, 9 pages.
Office Action issued for Japanese Patent Application No. 2017-146662 dated Aug. 7, 2018, along with English translation, 6 pages.
Office Action issued for Japanese Patent Application No. 2015-134106 dated Aug. 28, 2018, along with English translation, 13 pages.
Office Action issued for Japanese Patent Application No. 2017-529720 dated Sep. 25, 2018, along with English translation, 12 pages.
Office Action issued for U.S. Appl. No. 15/532,855 dated Oct. 12, 2018, 19 pages.
Office Action issued for U.S. Appl. No. 15/645,774 dated Oct. 18, 2018, 28 pages.
Office Action issued for Japanese Patent Application No. 2017-529717 dated Nov. 27, 2018, along with English translation, 4 pages.
Office Action issued for U.S. Appl. No. 14/975,415 dated Dec. 13, 2018, 16 pages.
Office Action issued for Eurasian Patent Application No. 201791234 dated Dec. 11, 2018, along with English translation, 2 pages.
Office Action issued for Chinese Patent Application No. 201510505370.5 dated Dec. 14, 2018, along with English translation, 6 pages.
Office Action issued for U.S. Appl. No. 15/532,845 dated Dec. 31, 2018, 33 pages.
Office Action issued for Eurasian Patent Application No. 201791237 dated Dec. 26, 2018, along with English translation, 4 pages.
Office Action issued for Chinese Patent Application No. 201480084542.X dated Dec. 29, 2018, along with English translation, 24 pages.
Office Action issued for Indonesian Patent Application No. P-0020172411 dated Feb. 12, 2019, 2 pages.
Office Action issued for Chinese Patent Application No. 20148004528.X dated Feb. 28, 2019, along with English translation, 18 pages.

(56) References Cited

OTHER PUBLICATIONS

Office Action issued for Japanese Patent Application No. 2017-146662 dated Mar. 26, 2019, along with English translation, 11 pages.
Examination Report, in corresponding Philippine Patent Application No. 1/2015/500539, dated Apr. 10, 2019, 5 pages.
Office Action issued for U.S. Appl. No. 15/532,855 dated May 2, 2019, 57 pages.
Office Action issued for Japanese Patent Application No. 2018-532069 dated May 28, 2019, along with English translation, 15 pages.
Office Action issued in Brazilian Patent Application No. PI0916880-0 dated May 28, 2019, 7 pages.
Extended European Search Report issued in European Patent Application No. 16866871.3, dated Jul. 3, 2019, 10 pages.
Substantive Examination Report issued in Philippine Patent Application No. 1/2015/500541, dated Jul. 5, 2019, 7 pages.
Office Action issued for U.S. Appl. No. 15/532,845 dated Jul. 9, 2019, 67 pages.
Extended European Search Report issued in European Patent Application No. 16876262.3, dated Jul. 19, 2019, 11 pages.
Office Action issued for Japanese Patent Application No. 2017-529720 dated Jul. 23, 2019, along with English translation, 17 pages.
Office Action issued in Chinese Patent Application No. 201680078860.4, dated Aug. 1, 2019, with English translation, 31 pages.
Office Action issued in Indonesian Patent Application No. P-00201702394 dated Aug. 19, 2019 (no English translation), 3 pages.
Office Action issued in Eurasian Patent Application No. 201791234, dated Aug. 27, 2019, with English translation, 3 pages.
Office Action issued in connection with Eurasian Patent Application No. 201791237, dated Aug. 29, 2019, with English translation, 3 pages.
Office Action issued in Chinese Patent Application No. 201480084542.X, dated Sep. 11, 2019, with English translation, 22 pages.
Office Action issued in Chinese Patent Application No. 201680081988.6, dated Sep. 25, 2019, with English translation, 35 pages.
Office Action issued in Indonesian Patent Application No. P-00201704208, dated Oct. 8, 2019 (no English translation), 3 pages.
Office Action issued in Eurasian Patent Application No. 201891175, dated Oct. 16, 2019, (no English translation), 2 pages.
Office Action issued in Chinese Patent Application No. 201480084528.X, dated Nov. 7, 2019, with English translation, 16 pages.
Office Action issued for U.S. Appl. No. 15/532,845 dated Dec. 12, 2019, 58 pages.

\* cited by examiner

PLASMA SOURCE AND METHODS FOR DEPOSITING THIN FILM COATINGS USING PLASMA ENHANCED CHEMICAL VAPOR DEPOSITION

CROSS REFERENCE TO RELATED APPLICATION

This application is a continuation of U.S. application Ser. No. 14/148,606, filed Jan. 6, 2014, which is a divisional of U.S. application Ser. No. 12/535,447, filed Aug. 4, 2009, now U.S. Pat. No. 8,652,586, issued Feb. 18, 2014, which claims the benefit of U.S. Provisional Application No. 61/137,839, filed Aug. 4, 2008, each of which are hereby incorporated by reference in their entireties into the present application.

BACKGROUND OF THE INVENTION

Field of the Invention

The present invention relates generally to a plasma source for deposition of thin films and chemical modification of surfaces. More particularly, the present invention relates to a linear plasma source for plasma enhanced chemical vapor deposition (CVD).

Discussion of the Background

All United States patents and patent applications referred to herein are hereby incorporated by reference in their entireties. In the case of conflict, the present specification, including definitions, will control.

The deposition of thin films can be accomplished by many techniques, the most common including chemical deposition, physical deposition and mixtures of the two. For chemical deposition, well-known techniques are plating, chemical solution deposition (CSD) and chemical vapor deposition (CVD). Plating and CSD generally utilize liquid chemical precursors while CVD generally utilizes gaseous chemical precursors. These techniques can be done at atmospheric pressure or under vacuum conditions. For physical deposition, well-known techniques are thermal evaporation, sputtering, pulsed laser deposition and cathodic arc deposition. These physical deposition techniques generally utilize vacuum conditions in order to deposit the desired thin film materials. With respect to chemical deposition, the most common technique is CVD, whereas for physical deposition, the most common technique is sputtering.

CVD generally requires that an energy source be included in order to create conditions such that a precursor gas will adhere, or stick, to a substrate surface. Otherwise, adhesion to a surface will not occur. For example, in a pyrolytic CVD process whereby a thin film coating is desired on a flat glass substrate, it is typical for the glass substrate to be heated. The heated glass substrate acts as the CVD energy source and when the precursor gas contacts the heated glass substrate, the precursor gas adheres to the hot glass surface. The heated surface also provides the energy needed to cause the precursor gas to chemically react to form the final thin film coating composition.

A plasma is also able to act as the energy source for CVD type processes, known as plasma enhanced CVD, or PECVD. A plasma is composed of a partially ionized gas and free electrons, and each component has the ability to move somewhat independently. This independent movement makes the plasma electrically conductive, such that it can respond to electromagnetic fields. This electrical conductivity provides PECVD processes with a number of advantages over other known chemical and physical deposition techniques.

In a PECVD process, the depositing material is typically derived from a precursor gas. Examples of such precursor gases are well-known to those of skill in the art. For example, if an Si-based thin film is to be deposited, a common precursor gas is silane, $SiH_4$. When $SiH_4$ is subject to a source of plasma, the plasma can act to raise the energy level of the silane molecule to the point where it will react with a surface and attach as a solid layer. More specifically, the $SiH_4$ becomes ionized, with its electrons moving to a higher energy level. This is accompanied by subsequent stripping off of the hydrogen atoms. The ionized molecules have open reactant sites available and, if in the presence of a reactant gas such as oxygen, can readily form a thin film of $SiO_2$. If the ionized molecules are not in the presence of a reactant gas, a thin film of silicon can be formed. The precursor gas chemistry exists for a plethora of elements, and thus, there is a large availability of elements and materials that can be deposited by PECVD. Without limitation, the types of thin films that can be deposited by PECVD are transparent conductive oxide thin film coatings, solar control and optical thin film coatings and semiconductor thin film coatings. Other types of thin film coatings that are able to be deposited by PECVD will be recognized and appreciated by those of ordinary skill in the art.

Thus, creating a plasma in proximity to a surface is a common industrial practice, particularly in the coating industry. Many devices have been developed to create and shape plasmas. Most known devices create a cylindrically shaped plasma plume, which have numerous practical applications for coatings and surface treatment. However, linear plasmas potentially have more practical applications. Linear plasmas can be made to work over large substrate surface areas, which is useful for large area glass coating, web coating and multipart batch coating.

To date, most known PECVD apparatuses are for small scale (i.e. <1 $m^2$) depositions since most plasma sources are very short and can only coat small areas. Thus, PECVD applied to large area coating has been difficult to implement. However, there have been PECVD apparatuses designed for coating large area surfaces. These include, without limitation, magnetron sources, anode layer ion sources and Madocks sources.

However, there are drawbacks associated with using the aforementioned PECVD apparatuses for coating large area surfaces. Magnetron sources, for example, tend to quite bulky, typically 150 mm wide by 300 mm deep, and require magnets. Also, when used for PECVD, the surface of a magnetron source tends to become coated with the material being deposited, and thus, the magnetron becomes insulated, which can lead to arcing and other complications. Furthermore, the sputtered material contaminates the material being deposited. Anode ion layer sources, for example, suffer from similar drawbacks as magnetron sources in that they tend to be bulky, require magnets, as well as become coated. Furthermore, anode ion layer sources tend to deposit PECVD materials at a low rate, 0.1 µm/second. Madocks sources, for example, suffer from the drawbacks of being bulky and requiring magnets, as well as low coating efficiencies, about 15%. Moreover, all three of the aforementioned sources rely on closed circuit electron drift (e.g., the Hall effect) to create a uniform plasma.

It is possible to create a uniform plasma without the reliance upon closed circuit electron drift, or the Hall effect. A common approach to doing this is to have two electron emitting surfaces aligned substantially parallel with respect to each other, wherein the electron emitting surfaces are connected to each other in a bipolar and out of phase manner via an AC power source. When a voltage difference is applied to both electron emitting surfaces, a plasma can be created. The polarities between the two electron emitting surfaces are switched from positive to negative at some predetermined frequency and the plasma becomes spread out and uniform.

Plasma sources based on parallel electron emitting surfaces have been developed. One such source is a hollow cathode source, such as that described in U.S. Pat. No. 6,444,945. More specifically, the plasma source described in U.S. Pat. No. 6,444,945 includes a structure made up of two hollow cathode shapes connected to a bipolar AC power supply, as shown in FIG. 1. The plasma source includes first and second hollow cathode structures 1 and 2. The two hollow cathode structures 1 and 2 are electrically connected by wires 6 to an AC power source 5 which generates an AC current to drive the formation of plasma 3. While one of the hollow cathode structures is subjected to a negative voltage, the other hollow cathode structure is subjected to a positive voltage, creating a voltage difference between the hollow cathode structures and causing current to flow between the structures, thereby completing the electric circuit. Optionally, magnets 4 may be disposed in proximity to the openings of each hollow cathode to enhance the plasma current between hollow cathode structures 1 and 2. However, U.S. Pat. No. 6,444,945 does not address the use of the disclosed hollow cathodes for any PECVD process or for large area surface coating.

Thus, there remains a need in the large area coating art for a plasma source, or a PECVD source, that can create a uniform and stable plasma of considerable length, i.e., greater than 0.5 meters in length. There also remains a need in the art for a PECVD source that is compact and can deposit a coating with high coating efficiencies. There further remains a need in the art for a PECVD source and process that consumes less energy during operation such that overall operating costs are reduced.

SUMMARY OF THE INVENTION

In an aspect of the invention, there is provided a stable, uniform and long plasma.

In an aspect of the invention, there is provided a plasma source that is able to form a stable, uniform and long plasma.

In an aspect of the invention, there is provided a pair of electron emitting surfaces that act as a linear plasma source.

In an aspect of the invention, there is provided a series of electron emitting surfaces that act as a two dimensional plasma source.

In another aspect of the invention, there is provided a method of forming a stable, uniform and long linear plasma.

In another aspect of the invention, there is provided a method of forming a stable, uniform and long two dimensional plasma.

In another aspect of the invention, there is provided a plasma that acts as an energy source for precursor gases.

In another aspect of the invention, there is provided a method of delivering precursor gases to the plasma source.

In yet another aspect of the invention, there is provided a method of forming large area coatings using a stable, uniform and long plasma.

In yet another aspect of the invention, there is provided a densified plasma created with the aid of magnets.

In yet another aspect of the invention, there is provided a method of bending a densified plasma source.

In yet another aspect of the invention, there is provided a method of increasing the coating efficiency of a coating deposited by a PECVD process.

In yet another aspect of the invention, there is provided a PECVD device that is conducive to secondary electron flow.

These and other aspects are achieved, in accordance with the principles of a preferred embodiment of the invention, by providing least 2 electron emitting surfaces connected to each other via an AC power source, wherein the AC power source supplies a varying or alternating bipolar voltage to the 2 electron emitting surfaces. More specifically, the at least 2 electron emitting surfaces are connected to one another via an AC power source such that the AC power source applies a bipolar voltage difference to the two electron emitting surfaces. The bipolar power supply initially drives a first electron emitting surface to a negative voltage, allowing plasma formation, while the second electron emitting surface is driven to a positive voltage in order to serve as an anode for the voltage application circuit. This then drives the first electron emitting surface to a positive voltage and reverses the roles of cathode and anode. As one of the electron emitting surfaces is driven negative, a discharge forms within the corresponding cavity. The other cathode then forms an anode, causing electrons to escape the plasma and travel to the anodic side, thereby completing an electric circuit.

The arrangement of the electron emitting surfaces in accordance with the present invention may operate in two general modes, normal and thermionic. In normal mode, the temperature of the electron emitting surfaces is kept relatively low and controlled by water cooling or other cooling methods. The cathode, when in normal mode, requires a few hundred to a few thousand volts to operate, with electron current remaining relatively low. In thermionic mode, the electron emitting surfaces are allowed to rise in temperature from plasma heating effects or from a separate heating device. When the electron emitting surfaces reach high temperatures, electron emission rises by at least an order of magnitude higher than that of a cold cathode, resulting in a high cathode discharge current at a relatively low voltage. The temperature required to reach thermionic mode and the electron voltage required for efficient operation will be partially dependent on the work function of the material of the cathode.

When desired, magnets and/or additional electrodes may be used in conjunction with the arrangement of electron emitting surfaces in accordance with the present invention. The use of magnets and/or additional electrodes results in densification of the plasma created by the PECVD sources of the present invention. The plasma source in accordance with the present invention may be used, without limitation, in any of a variety of applications in which stable, uniform and long plasmas are required, such as large area coatings for coating, for example, monolithic glass and/or glass ribbon.

The present invention offers a number of distinct advantages and design features over prior art plasma sources. These include, but are not limited to: 1) the apparatus for the creation of the plasma in accordance with the present invention can be made to be highly compact, with a distance between two electron emitting surfaces as small as about 0.5 mm and a total height of less than about 60 mm; 2) the plasma source can be made to be linear and long, e.g., >0.5 meters; 3) the electron emitting surfaces can be kept clean by gas protection and/or by thermal evaporation (e.g., the surfaces do not become coated); 4) a precursor gas can be thermally and/or electrically energized for higher reactivity; 5) the plasma source is capable of high plasma current per unit length; 6) the plasma source can create a plasma density that exceeds those of capacitive or diode type systems; and 7) the plasma created from the plasma source may be made two dimensional.

The inventor of the subject matter herein has surprisingly found that the aforementioned advantages lead to: 1) high secondary electron current between secondary electron surfaces; 2) high deposition rate of large area coatings; 3) large area coatings that may be microns thick but have low stress; 4) large area coatings that may be microns thick but are smooth; and 5) large area coatings that are microns thick but have low haze.

DETAILED DESCRIPTION OF THE INVENTION

Figure 1:
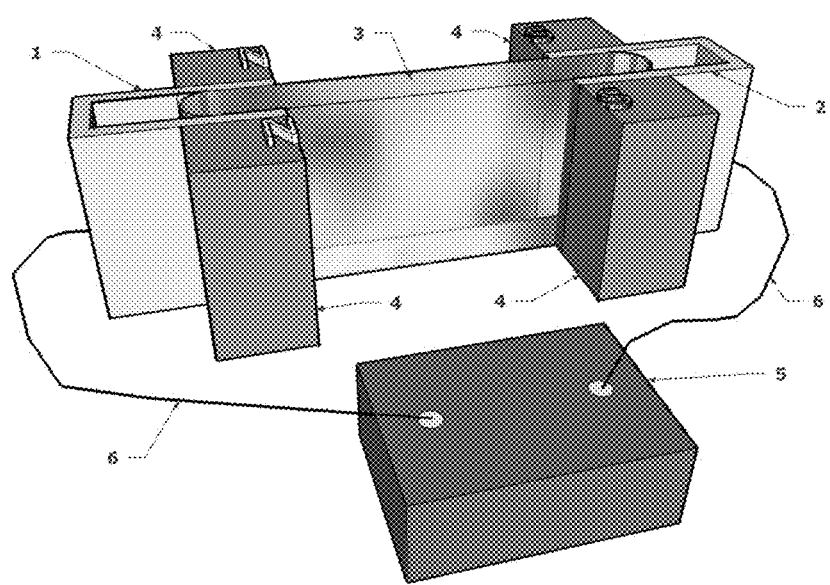
FIG. 1 shows a prior art hollow cathode apparatus.

While the present invention may be embodied in many different forms, a number of illustrative embodiments are described herein with the understanding that the present disclosure is to be considered as providing examples of the principles of the invention and such examples are not intended to limit the invention to preferred embodiments described and/or illustrated herein. The various embodiments are disclosed with sufficient detail to enable those skilled in the art to practice the invention. It is to be understood that other embodiments may be employed, and that structural and logical changes may be made without departing from the spirit or scope of the present invention.

As referred to herein, "dark space" is taken to mean a narrow zone or area around an electrode whereby plasma current is very low. Generally, two oppositely charged plasma electrodes or a plasma electrode and a ground potential conductor spaced apart by the dark space distance will exhibit substantially no current flow between them.

"Hollow Cathode" is taken to mean a plasma forming device typically comprised of primarily facing cathodic surfaces and a third proximal anodic surface. The facing cathodic surfaces are spaced such that electrons oscillate between the negative electric fields of the surfaces and are thereby confined.

"Precursor gas" is taken to mean a gas in molecular form containing a chemical element or elements to be condensed into a solid coating. The elements to be condensed from the precursor gas may include metals, transition metals, boron, carbon, silicon germanium and/or selenium. Generally, a precursor molecule is unreactant or not prone to attaching on a surface until energized, partially decomposed, or fully decomposed by an energy source, whereupon a chemical fragment of the precursor gas containing the desired chemical element for coating becomes chemically able to bond to or condense upon a surface in a solid form. The condensed portion of the precursor compound may be primarily a pure element, a mixture of elements, a compound derived from the precursor compound constituents or a mixture of compounds.

"Reactant gas" is taken to mean oxygen and/or nitrogen. It is often desirable to deposit compounds on a surface which may not be chemically available from the precursor gas alone. Often, reactant gases such as oxygen or nitrogen are added to the CVD process to form oxides or nitrides. Other reactant gases may comprise fluorine, chlorine, other halogens or hydrogen. A reactant gas may be differentiated from a precursor gas by the fact that even when energized or chemically decomposed, condensable molecular entities are not formed. Generally, reactant gases or reactant gas fragments cannot by themselves grow a solid deposition but they can react and become chemically incorporated into a solid deposition derived from precursor gases or other solid deposition sources.

"Substrate" is taken to mean either a small area or large area item to be coated or have its surface chemically modified by this invention. Substrate referred to herein can be comprised of glass, plastic, inorganic materials, organic materials or any other material that has a surface to be coated or modified.

"Plasma" is taken to mean an electrically conductive gaseous medium comprising both free electrons and positive ions.

"Hall current" is taken to mean an electron current caused by crossed electric and magnetic fields. In many conventional plasma forming devices the Hall current forms a closed circulating path or "racetrack" of electron flow.

"AC power" or "AC power source" is taken to mean electric power from an alternating source wherein the voltage is changing at some frequency in a manner that is sinusoidal, square wave, pulsed or some other waveform. Voltage variations are often from negative to positive. When in bipolar form, power output delivered by two leads is generally about 180° out of phase.

"Thermionic" is taken to mean electron emission from a surface where emission is greatly accelerated by high surface temperature. Thermionic temperatures are generally about 600° C. or greater.

"Work function" is taken to mean the minimum energy, in electron volts (eV), needed to remove an electron from a solid surface to a point immediately outside the solid surface.

"Secondary electron" or "secondary electron current" is taken to mean electron emission from a solid surface as a result of bombardment of that surface by a particle and the current that is created as a result, respectively.

The inventor of the subject matter herein has surprisingly found that a long (e.g., >0.5 meter), stable and uniform linear plasma, beneficial for PECVD processes, can be created without relying on closed circuit electron drift (e.g., the Hall effect). This may be achieved by providing least 2 electron emitting surfaces connected to each other via an AC power, wherein the AC power source supplies a varying or alternating bipolar voltage to the 2 electron emitting surfaces. More specifically, the at least 2 electron emitting surfaces are connected to one another via an AC power source such that the AC power source applies a bipolar voltage difference to the two electron emitting surfaces. The bipolar power supply initially drives a first electron emitting surface to a negative voltage, allowing plasma formation, while the second electron emitting surface is driven to a positive voltage in order to serve as an anode for the voltage application circuit. This then drives the first electron emitting surface to a positive voltage and reverses the roles of cathode and anode. As one of the electron emitting surfaces is driven negative, a discharge forms within the corresponding cavity. The other cathode then forms an anode, causing electrons to escape the plasma and travel to the other side, thereby completing an electric circuit.

The electron emitting surfaces in accordance with the present invention generate a plasma and the two surfaces are, in turn, further impinged upon by electrons or ions. The impingement of the electron emitting surfaces by electrons, or ions, results in secondary electrons emitted from the electron emitting surfaces. Secondary electron emission is important because secondary electron flow aids in creating a densified plasma. The space that exists between the two electron emitting surfaces is where the electric current comprising electrons and/or ions flows. This space can be made to vary in distance depending on the coating parameters to be used. This distance may be between about 1 mm to about 0.5 meters and is determined, in part, by the design of the plasma forming apparatus and operating gas pressure surrounding the electron emitting surfaces.

To increase the electron emission of the electron emitting surfaces, the electron emitting surfaces may be comprised of low work function material such as thoriated tungsten or other similar materials. Alternatively, the electron emitting surfaces may be heated to a temperature range of about 600° C. to about 2000° C. to increase electron emission, e.g., thermionic emission. A preferred temperature range is about 800° C. to about 1200° C. When the electron emitting surfaces are held at elevated temperatures, less voltage is needed to create a plasma. When at elevated temperature, a range of voltage may be from about 10 volts to about 1000 volts. A preferred range is about 30 volts to about 500 volts. When the electron emitting surfaces are cooled by water or other cooling means, more voltage is needed to create a plasma. When at such lower temperatures, a range of voltage may be from about 100 volts to about 2000 volts. A preferred range is from about 300 volts to about 1200 volts.

Electron emission may also be increased by the formation of a hollow cathode or electron oscillation effect. When any single electron emitting surface is formed to consist of two facing surfaces at the same electrical potential, electrons may oscillate and become confined between those two facing surfaces. The optimal distance between electron emitting surfaces increases with decreasing pressure. Typical operating pressures may be from about atmospheric pressure to about $10^{-4}$ millibar. A preferred operating pressure in accordance with the present invention is from about 1 millibar to about $10^{-3}$ millibar. Therefore, at an operating gas pressure of about 1 millibar, the optimal distance may be about 2 mm to about 30 mm. A preferred distance is from about 3 mm to about 10 mm. At an operating gas pressure of about $10^{-3}$ millibar, the optimal distance may be from about 10 mm to about 100 mm. A preferred distance is from about 10 mm to about 30 mm. The length of the plasma in accordance with the present invention can be made as long or as short as needed by varying the length of the electron emitting surfaces. Plasmas in accordance with the present invention can be made to be very long, >0.5 meters. Preferably, plasmas in accordance with the present invention are greater than one meter long.

The electrode emitting surfaces may also be comprised of a porous electrically conductive material, such as metal, graphite, silicon carbide, titanium diboride. When the design incorporates these porous materials for the electron emitting surfaces, the reactant gas may also be delivered through these surfaces. This method of reactant gas injection tends to prevent precursor gas from contacting the walls and forming a coating.

Figure 3:
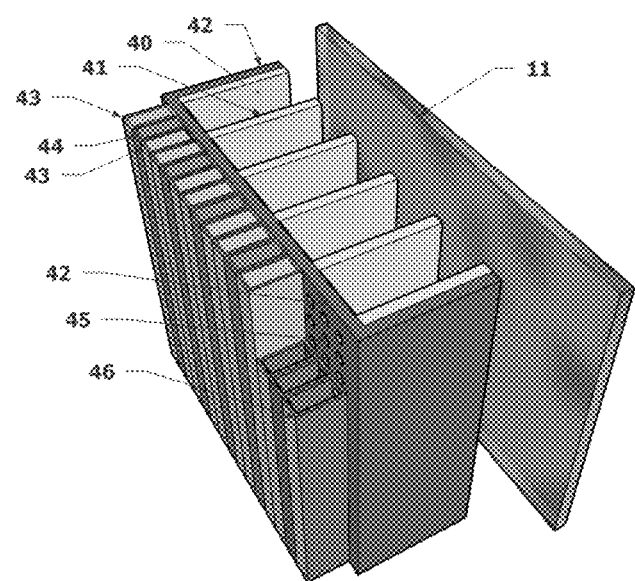
FIG. 3 shows an array of the basic linear PECVD device of FIG. 2.
Figure 5:
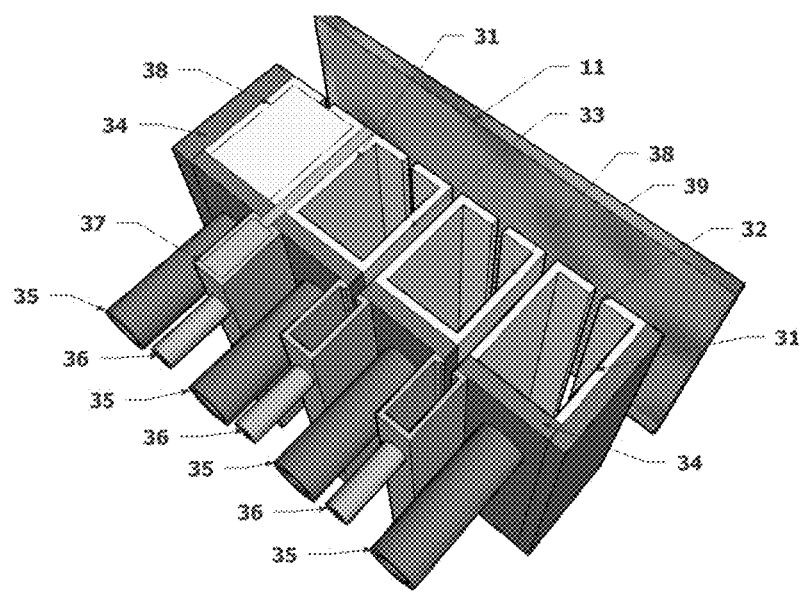
FIG. 5 shows an array of hollow cathodes in a PECVD device in accordance with the present invention.

If desired, the number of electron emitting surfaces may be increased to form an array of electron emitting surfaces, such as those depicted in FIGS. 3 and 5. The inventor of the subject matter herein has surprisingly found that such arrays of electron emitting surfaces are able to form plasmas that have not only length, but also significant width. In other words, the arrays, such as those depicted in FIGS. 3 and 5, are able to form two dimensional plasmas. Such array type PECVD sources offer an advantage over those with only two electron emitting surfaces. The inventor of the subject matter herein has also unexpectedly discovered that the "dark space" that exists between positively and negatively biased electron emitting surfaces can be exploited for precursor and/or reactant gas delivery into the alternating electron current space. Plasmas are known not to stray into such "dark spaces" and, thus, the precursor and/or reactant gas can be delivered proximate to a substrate without any significant degradation or reaction of the precursor and/or reactant gases prior to reaching a surface of a substrate desired to be coated.

While not necessary for creation of a uniform, long and stable plasma in accordance with the present invention, magnets may be utilized with the plasma sources described herein and offer several advantages that include, but are not limited to the following: 1) magnets may be used where no significant Hall Current is formed; 2) a densified plasma may be formed by converging magnetic field lines; 3) the magnetic field lines used to create a densified plasma may pass proximate to, or even through, a surface of a substrate; 4) a magnetic "mirror" may be formed in the current path between electron emitting surfaces; and 5) a densified plasma can be made to contact an additional electrode.

The aforementioned advantages of the apparatus and plasma source in accordance with the present invention have direct impact in the field of large area coatings, such as large area glass coatings. Glass substrates are coated with thin films that include, but are not limited to: 1) dielectric thin films; 2) transparent conductive thin films; 3) semi-conducting thin films; and 4) solar control thin films. Regarding the aforementioned groups of coatings, properties such as crystallinity, tensile stress and porosity can be tailored by adjusting certain deposition parameters of the plasma sources in accordance with the present invention.

Regarding transparent conductive thin film large area coatings, the degree of crystallinity directly affects the degree of conductivity of transparent conductive films. Conventionally, most transparent conductive layers are deposited, by sputtering or CVD, when the substrate is at elevated temperature. It is the elevated temperature of the substrate that gives the deposited transparent conductive material the energy needed to rearrange into a crystallinity optimal for electrical conductivity. The need to elevate the temperature of the substrate, such a glass substrate, gives rise to a number of drawbacks. These drawbacks include, but are not limited to: 1) heating and cooling of a substrate; 2) apparatus that can handle heating and cooling of the substrate; 3) the cost associated with heating and cooling of the substrate; and 4) the time required to heat and cool a substrate tends to be long (at least 1 hour). The plasma source of the PECVD device in accordance with the present invention circumvents these drawbacks because transparent conductive thin films can be deposited without the requirement of a substrate at elevated temperature. Rather than a substrate at elevated temperature being the energy source that facilitates the rearrangement to an optical crystallinity, that energy can be provided by the plasma itself, and the aforementioned drawbacks can be eliminated.

Regarding dielectric thin film large area coatings, PECVD type methods are difficult to implement for large surface area coatings. Most dielectric films for such large area surface coatings are deposited by sputtering type methods. These methods have been used for production of dielectric coatings that are relatively thin, about 0.1 µm or less. Thus, to date, thick, about 0.1 µm or more, dielectric coatings for large surface area coatings have been limited. The plasma source of the PECVD device in accordance with the present invention circumvents this limitation because it enables the use of high rates of deposition, e.g., at least about 0.2 µm/second or more. A preferred rate of deposition is about 0.3 µm/second. A most preferred rate of deposition is about 0.5 µm/second. This high rate of deposition, in turn, allows for a thicker dielectric coating when the PECVD device in accordance with the present invention is adapted for large area surface coating.

Regarding semiconductor thin film large area coatings, such as thin film silicon on glass for photovoltaic applications, conventional semiconducting thin film deposition methods are limited by a slow rate of material deposition. The plasma source of the PECVD device in accordance with the present invention circumvents this limitation because enables the use of high rates of deposition, e.g., at least about 0.2 µm/second or more. This high rate of deposition, in turn, allows for a thicker semiconductor thin film coating when the PECVD device in accordance with the present invention is adapted for large area surface coating.

The different materials that can be deposited by the PECVD device and methods in accordance the present invention are not particularly limited to dielectric materials, transparent conductive materials and/or semiconducting materials. If desired, organic materials can be deposited with the PECVD device and methods in accordance with the present invention. For example, an organic monomer that is subjected to a plasma from the PECVD device described herein would be provided with sufficient energy to undergo polymerization.

The following embodiments of the present invention are not intended to be limiting in any way. Those of skill in the art will recognize and appreciate how to adapt the devices and methods described herein without departing from the spirit or scope of the present invention.

Figure 2:
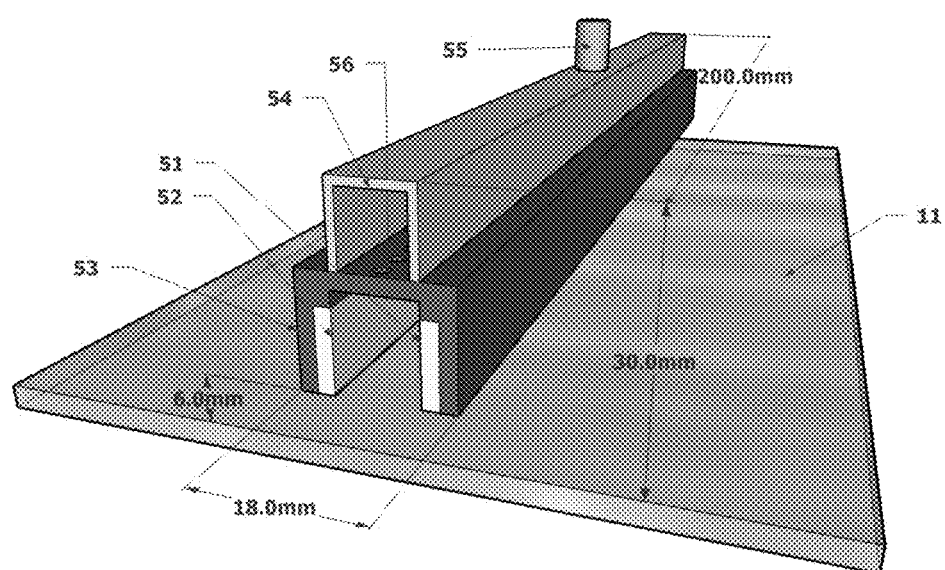
FIG. 2 shows a basic linear PECVD device in accordance with the present invention.

An embodiment of present invention is shown in FIG. 2, which depicts an arrangement of two electron emitting surfaces 51 and 52 that are connected to an alternating current bipolar electrical power source (not shown) such that the voltages of surfaces 51 and 52 are out of electrical phase with one another. Voltages may run from 300 to 1200 volts and typically when one surface is negatively biased the other is positively biased. However, both electron emitting surfaces may be either positively or negatively biased, as long as there is sufficient voltage difference to drive plasma formation. Polarity may be switched at some predetermined frequency, usually between about 10 Hz to $10^8$ Hz. A preferred range of frequency in accordance with the present invention is about $10^3$ Hz to $10^7$ Hz. The embodiment of the present invention shown in FIG. 2 demonstrates the compact nature of the PECVD source, which is approximately 18 mm wide and 30 mm in height. These dimensions are much smaller than most known and conventional plasma sources. The distance from the bottom of the PECVD device of FIG. 2 to substrate 11 may be from about 3 mm to about 100 mm. A preferred distance is from about 6 mm to about 50 mm. Typically, the substrate 11 will be moving at a predetermined rate below the plasma source, but may be stationary if desired.

A precursor gas may be injected through inlet tube 55 into precursor manifold 54 so that the precursor gas then enters the plasma current region through a row of holes 56 and then interacts with the plasma. Advantageously, the created plasma provides a large amount of energy that is available to activate, ionize, and/or break up the precursor gas molecules at very high rates such that highly efficient coatings may be deposited on large area substrate 11. When the device of FIG. 2 is adapted for PECVD, deposition rates exceeding those reported for other linear, large area deposition sources can be realized. Surprisingly, deposition rates may be as high as 0.5 µm/second or higher. Insulation layer 53 restricts plasma generation to the region between electron emitting surfaces 51 and 52. In other words, insulation layer 53 restricts the plasma from leaving the space defined by electron emitting surfaces 51 and 52 and entering the environment.

Surprisingly, the plasma formed between the two surfaces 51 and 52 spreads out linearly and uniformly along the length of the surfaces. The operation of the PECVD device of FIG. 2, a plasma is generated that is approximately 200 mm long. However, the plasma may be several meters long and still maintain stability and uniformity. The specific dimensions of the PECVD device of the present invention can be modified from those discussed herein to change the plasma length, as will be recognized and appreciated by those of skill in the art in view of the disclosure herein. The plasma current in the region between surfaces may be relatively high, in the range of 1 or 2 amps per 25 mm of length. Total power consumption by the device is high and may be 10 s of kWs per unit of length.

FIG. 2, and the remaining figures, shows the manifolds and other components of the PECVD sources described herein as open-ended for purposes of illustration only. Typically, the ends would be closed to contain any of the reactant gases, precursor gases and the plasma, as will be recognized and appreciated by those of skill in the art.

Shown in FIG. 3 is an embodiment of the PECVD source of the present invention. FIG. 3 is similar to FIG. 2 in that both embodiments depict electron emitting surfaces disposed parallel with respect to each other. In FIG. 3, however, the number of electrode emitting surfaces has been increased from 2 to 10, to form an array of electron emitting surfaces. The exact number of electron emitting surfaces is not particularly limited and may be adjusted as desired, as will be recognized and appreciated by those of skill in the art in view of the disclosure herein. Typically, 4 to 20 electron emitting surfaces may be used, but more than 20 may be used, if desired. As the number of electron emitting surface pairs is increased, so is the deposition rate capability of the PECVD device. The already high possible deposition rate of at least about 0.2 µm/second may be doubled if the number electron emitting surfaces is increased to four, or tripled if increased to six (e.g., 2 electron emitting surfaces corresponds to a deposition rate of at least about 0.2 µm/second; 4 electron emitting surfaces corresponds to a deposition rate of at least about 0.4 µm/second; 6 electron emitting surfaces corresponds to a deposition rate of at least about 0.6 µm/second). This increase in deposition rate may be continued to be scaled up as more electron surface pairs are added to the array.

To create a region of electron flow between each adjacent electron emitting surface, the electron emitting surfaces are alternately electrically connected to the poles of a bipolar power supply or pulsed power source (not shown). Preferably, the connection is made such that for any given surface, the voltages of the two surfaces on either side are out of phase with the one in the middle. Thus, a first electron emitting surface 40 and a second electron emitting surface 41 are powered by an alternating or pulsed voltage and are out of phase with one another. Subsequent electron emitting surfaces in the remaining array can be biased in such a way that every other surface of the array is electrically in phase. Electrical connections are made such that each electron emitting surface has on either side an electron emitting surface which is out of phase except for the electron emitting surfaces at either end of the array. An insulating wall 42 is disposed on the outside of the electron emitting surfaces in order to inhibit plasma formation outside of the array.

On the side of the PECVD device away from substrate 11 is a series of manifolds for reactant gas and precursor gas. Reactant gas manifolds 43 exist for each electron current space and are positioned so reactant gas may flow along the electron emitting surface. Precursor gas manifolds 44 are positioned so the precursor gas primarily flows through the center of the electron current flowing space. This positioning of reactant gas manifolds 43 and precursor manifolds 44 is to reduce deposition of precursor materials on the electron emitting surfaces 41 and 40. Accordingly, each electron flowing space has three associated manifolds. Precursor gas manifolds 44 may be fed by different precursor gases so that a multilayer deposition is formed on substrate 11 as it moves past the PECVD source of FIG. 3. As a non-limiting example, if a glass coating system of: glass/$SiO_2$/$TiO_2$/$SnO_2$ is desired, three consecutive precursor gas manifolds may be supplied with the appropriate precursor gases that comprise silicon, titanium and tin, respectively.

Reactant gas manifolds 43 may also be fed by different gas materials. As a non-limiting example, if an oxynitride type layer is desired, the reactant gas manifold may be supplied with oxygen and nitrogen. Reactant and precursor gases flow from the manifolds 43 and 44 through holes 45 in insulating wall 42. Three manifolds 46 are cut short in FIG. 3 to show the rows of holes 45 for gas flow into the current flowing space.

For the coating or surface treatment of large area substrates, the array may be elongated to lengths of at least 2 to 3 meters, as will be recognized and appreciated by those of skill in the art in view of the disclosure herein. In FIG. 3, elongation would occur in the upward direction, or coming out of the plane of the paper.

The entire array may be driven by one power supply (not shown). Surprisingly, from one power supply, not only is the plasma uniformly distributed along the length of each surface, but also it is uniformly distributed from electron emitting surface to electron emitting surface of the array, thereby creating a two dimensional plasma. This two dimensional uniform spread of plasma allows for unexpectedly high rates of deposition, about 0.5 µm/second or higher, of materials onto a substrate surface by PECVD.

The inventor of the subject matter described herein has found that elongated hollow cathodes can surprisingly be used as a PECVD source for coating large area surfaces. Hollow cathodes are two surfaces that are generally parallel with respect to each other wherein the surfaces are biased with electric voltage and are in phase with each other, similar to the electron emitting surfaces described herein. When biased at the proper voltage, the surfaces generate a plasma and the surfaces are then impinged upon by electrons or other ions.

Figure 4:
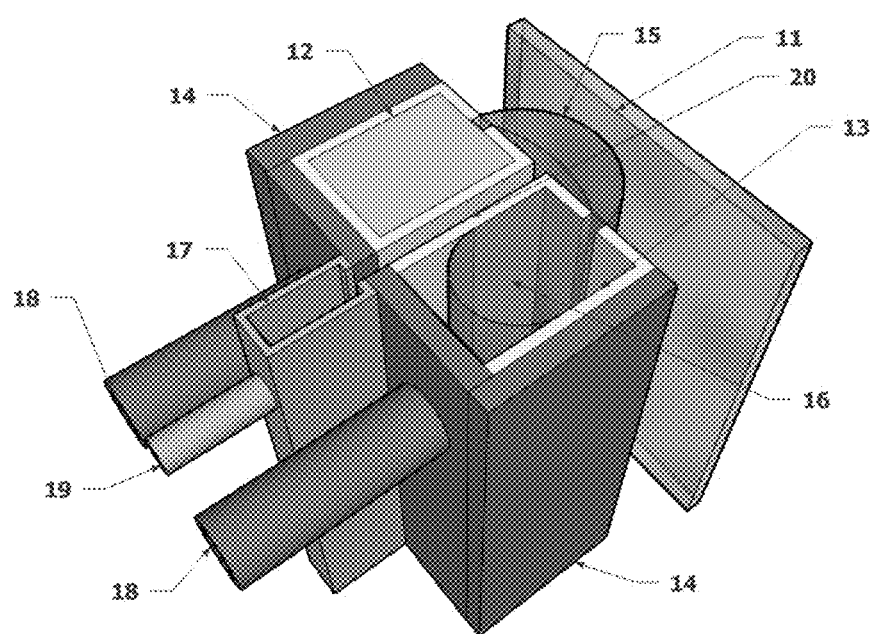
FIG. 4 shows a dual hollow cathode in a PECVD device in accordance with the present invention.

FIG. 4 shows a dual hollow cathode in accordance with the present invention. Hollow cathode 12 is disposed in close proximity to another hollow cathode 13. It is noted that the hollow cathodes are comprised of electron emitting materials. Electrically insulating material 14 is disposed around the hollow cathodes and restricts the plasma from traveling outside of the hollow cathodes to the environment. The areas of electron oscillation 16, which takes place between the hollow cathodes, and secondary electron current 15 are shown in FIG. 4. The PECVD source is disposed with a precursor gas manifold 17 and precursor gas inlet tube 19 for delivery of precursor gases intended to be deposited. Tubes 18 are also provided for delivery of reactant gases.

In the PECVD device of FIG. 4, between each of the hollow cathodes 12 and 13, a space 20, known as dark space, exists. A dark space between the dual hollow cathodes shown in FIG. 4 does not comprise a plasma or allow current flow between the cathodes, and thus, offers a channel for flow of precursor gases. It is advantageous to flow the precursor gases in the dark space 20 between the dual hollow cathodes because the absence of a plasma in the dark space 20 ensures that the precursor gases do not react or degrade prior to reaching the substrate 11 to be coated. In other words, no ionization of precursor or reactant gases can occur in the dark space. Optionally, if desired, the dark space 20 can be filled with an insulating material if gas flow is not desired within the space. The width of dark space 20 is dependent on pressure and may be from about 0.3 mm to about 3 mm in the pressure range of about 1 millibar to about $10^{-3}$ millibar.

For the coating or surface treatment of large area substrates, the hollow cathodes may be elongated to lengths of at least 2 to 3 meters. In FIG. 4, elongation would occur in the upward direction, or coming out of the plane of the paper.

Shown in FIG. 5 is an embodiment of a hollow cathode PECVD source of the present invention. FIG. 5 is similar to FIG. 4 in that both embodiments depict hollow cathodes disposed adjacently. In FIG. 5, however, the number of hollow cathodes has been increased from 2 to 4, to form an array of hollow cathodes disposed adjacently. The exact number of hollow cathodes is not particularly limited and may be adjusted as desired, as will be recognized by those of skill in the art in view of the disclosure herein. Typically, 4 to 8 hollow cathodes may be used, but more than 8 may be used, if desired.

The hollow cathodes of FIG. 5 are equipped with electron emitting surfaces 31 and 38 that facilitate oscillations between the two surfaces. In the device of FIG. 5, electron emitting surfaces 31 are electrically connected with voltages alternating in phase. Electron emitting surfaces 38 are out of phase with electron emitting surfaces 31. Thus, each electron emitting surface of the array would have on either side an electron emitting surface which is out of voltage phase. Slot 32 is for flow of current and plasma to adjacent electron emitting surfaces. The space 33 between the hollow cathodes denotes the dark space. The dark space 33 may be optionally filled by a solid insulator. The width of dark space is dependent on pressure and may be from about 0.3 mm to about 3 mm in the pressure range of about 1 millibar to about $10^{-3}$ millibar. The dark space 33 may be used for precursor gas flow from precursor feed tubes 36 and manifolds 37 to the region of electron current 39 between the electron emitting surfaces 31 and 38 and the substrate 11. The outer faces of the hollow cathodes at each end of the array and in the back of the array are covered by insulating material 34 to reduce plasma formation in the back or sides of the PECVD device of FIG. 5.

Reactant gas may be supplied directly into the region of electron oscillation through tubes 35. Different reactant gases may also be supplied through tubes 35. As a non-limiting example, if an oxynitride type layer is desired, the reactant gas manifold may be supplied with oxygen and nitrogen.

Precursor gas manifolds 36 may be supplied different precursor gases so that a multilayer deposition is formed on substrate 11 as it moves past the PECVD source of FIG. 5. As a non-limiting example, if a glass coating system of: glass/$SiO_2$/$TiO_2$/$SnO_2$ is desired, three consecutive precursor gas manifolds may be supplied with the appropriate precursor gases that comprise silicon, titanium and tin, respectively. In cases where very high deposition rate is desired for a single material, the same precursor gas may be injected into more than one precursor manifold 36. The deposition rate of at least about 0.2 μm/second that is achieved with this configuration may then be multiplied by the number of hollow cathode pairs. (e.g., one pair of hollow cathodes corresponds to a deposition rate of at least about 0.2 μm/second; two pair of hollow cathodes corresponds to a deposition rate of at least about 0.4 μm/second; three pair of hollow cathodes corresponds to a deposition rate of at least about 0.6 μm/second).

For the coating or surface treatment of large area substrates, the hollow cathodes may be elongated to lengths of at least 2 to 3 meters. In FIG. 5, elongation would occur in the upward direction, or coming out of the plane of the paper.

Figure 6:
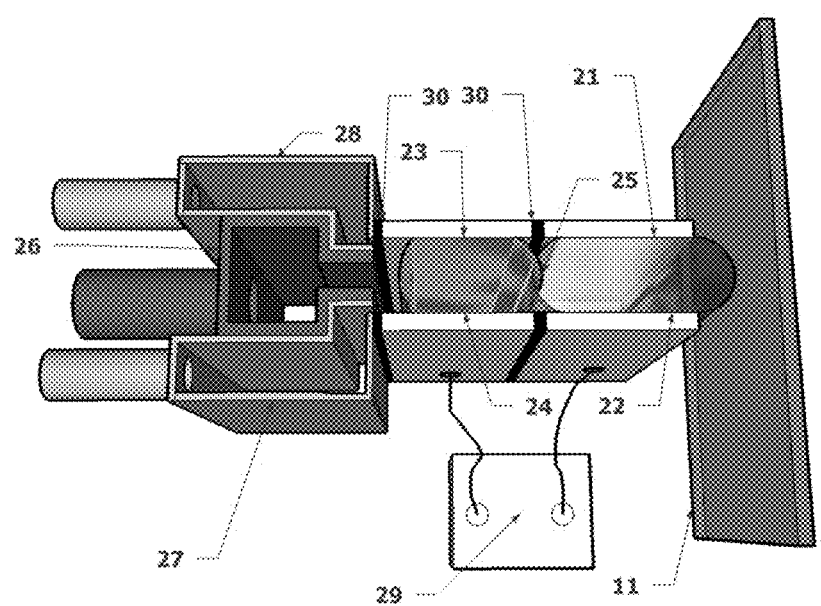
FIG. 6 shows an "in-line" arrangement of the PECVD device in accordance with the present invention.

Shown in FIG. 6 is a PECVD source in accordance with the present invention that can be described as an "in-line" PECVD source. The PECVD source of FIG. 6 is adapted to allow precursor and/or reactant gases to pass through the region 25 of plasma current. Electrically conductive walls comprising a plurality of electrode surfaces 21, 22, 23 and 24 are disposed adjacently and electron oscillation takes place between electrode surfaces of these walls, such as that between electrode surfaces 21 and 22 and 23 and 24. A bipolar power supply 29 can be used to connect to electrode surfaces 21 and 22 and 23 and 24. Electron oscillation occurs when electrode surfaces 21 and 22 are negatively biased with respect to electrode surfaces 23 and 24. This respective bias is then reversed in polarity at some frequency such that surfaces 23 and 24 become negatively biased with respect to surfaces 21 and 22. This reversing of polarity forms an alternating plasma current through plasma region 25. Although not shown, electrically conductive walls comprising electrode surfaces 21, 22, 23 and 24 may be covered on the outer surfaces by electrical insulation to suppress plasma formation on the outside of the walls.

The electrode surfaces 21, 22, 23 and 24 can be electrically isolated from each other by electrical insulators 30. Electrical isolators 30 may also be disposed between electrically conductive walls comprising electrode surfaces 23 and 24 and gas manifolds 26, 27 and 28. Manifold 26 may be used for precursor gas delivery, whereby the precursor gas travels down the center between electrically conductive walls comprising electrode surfaces 21, 22, 23 and 24. Reactant gas manifolds 27 and 28 allow for reactant gases to travel along these walls to prevent undesirable deposition from precursor.

Thus, the arrangement of "in-line" PECVD source can be thought of as a "plasma gamet" that the reactant and/or precursor gases are forced to "run" through. In this arrangement, the chance that the reactant and/or plasma gases become energized is dramatically increased because of the distance the gases must traverse and the exposure to the highest plasma energy in the plasma region to reach the substrate 11. For the coating or surface treatment of large area substrates, the apparatus may be elongated to lengths of at least 2 to 3 meters. In FIG. 6, elongation would occur in the upward direction, or coming out of the plane of the paper.

Figure 7:
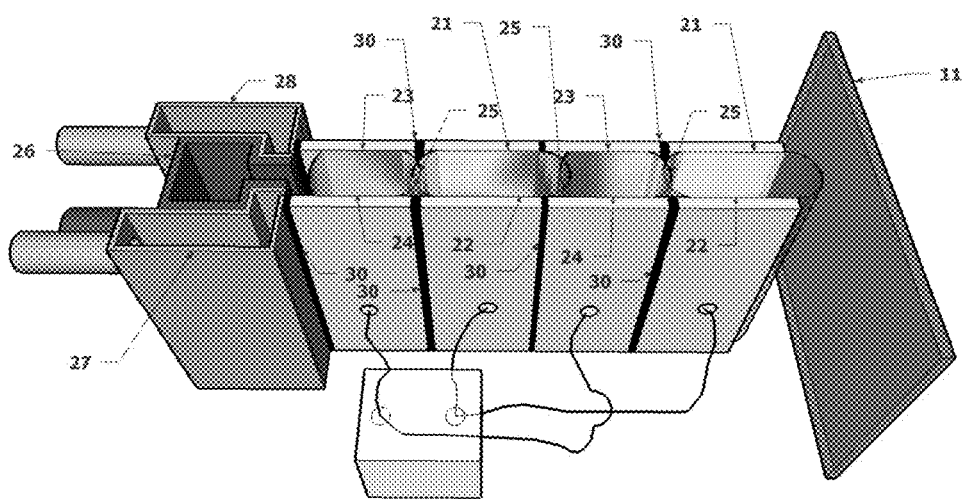
FIG. 7 shows another "in-line" arrangement of the PECVD device in accordance with the present invention.

FIG. 7 shows a PECVD source in accordance with the present invention that can also be described as an "in-line" PECVD source. The PECVD source of FIG. 7 is adapted to allow precursor and/or reactant gases to pass through the region 25 of electron oscillation and plasma formation. Electrically conductive walls comprising a plurality of electrode surfaces 21, 22, 23 and 24 are disposed adjacently and electron oscillation takes place between the electrode surfaces of these walls, such as that between electrode surfaces 21 and 22 and 23 and 24. A bipolar power supply can be used to connect to electrode surfaces 21 and 22 and 23 and 24. The electron oscillation occurs when electrode surfaces 21 and 22 are negatively biased with respect to electrode surfaces 23 and 24. At some frequency, respective bias polarity is reversed between surfaces 21, 22, 23 and 24. Although not shown, electrically conductive walls comprising electrode surfaces 21, 22, 23 and 24 may be covered by electrical insulation to suppress plasma formation on the outside of the walls.

Electrode surfaces 21, 22, 23 and 24 can be electrically isolated from each other by electrical insulators 30. Electrical isolators 30 may also be disposed between electrically conductive walls comprising electrode surfaces 23 and 24 and gas manifolds 26, 27 and 28. FIG. 7 shows the ends of the plasma forming walls and manifolds as open for purposes of illustration. Typically, the ends would be closed to contain any of the reactant gases, precursor gases and the plasma, as will be recognized by those of skill in the art in view of the disclosure herein. Manifold 26 may be used for precursor gas delivery, whereby the precursor gas travels down the center between electrically conductive walls comprising electrode surfaces 21, 22, 23 and 24. Reactant gas manifolds 27 and 28 allow for reactant gases to travel along these walls to prevent undesirable deposition from precursor.

Thus, the arrangement of the "in-line" PECVD source of FIG. 7 can be thought of as even more of a "plasma gamet" than the arrangement of FIG. 6 because the distance the reactant and/or precursor gases must traverse to reach the substrate 11 is even longer than that of FIG. 6. For the coating or surface treatment of large area substrates, the apparatus may be elongated to lengths of at least 2 to 3 meters. In FIG. 7, elongation would occur in the upward direction, or coming out of the plane of the paper.

Figure 8:
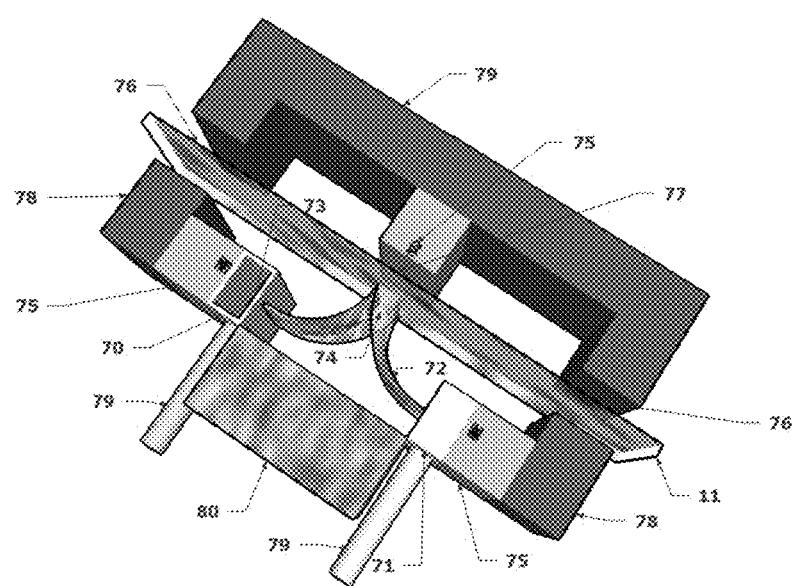
FIG. 8 shows a PECVD device in accordance with the present invention that comprises magnets.

FIG. 8 shows is a PECVD source in accordance with the present invention that includes the addition of magnets. The addition of a magnetic field aids in steering the electrons out of the normally straight current path between electron emitting surfaces. Thus, a densification of the plasma may be formed somewhat remotely from the plasma generating apparatus. If the magnetic field lines incorporate a "magnetic mirror" effect, a surprisingly dense and energetic localization of the plasma may be formed. This densified region may also be elongated into a uniform high energy plasma strip for use in surface modification or coating of large area substrates.

The magnetic mirror phenomenon is known in the field of plasma physics. The magnetic mirror effect exists where electric and magnetic fields are both present to accelerate and steer electron movement. If the magnetic field lines converge at some point, the electrons moving towards and into the convergence tend to be reflected back and caused to reverse direction. In the area of magnetic convergence, the electron density increases per unit area to create a region of negative electrical bias. Due to the negative charge present, positive ions may be accelerated into this region and these ions may, in turn, impinge upon a surface.

In the plasma source of FIG. 8, electrons are generated by first electron emitting surface 70 and by second electron emitting surface 71. In FIG. 8, the electron emitting surfaces are hollow tubes comprising walls for confining an oscillating electron plasma. Tubes 79 supply gas to tubes 70 and 71. Typically, this would be an inert gas, a reactant gas or a mixture thereof. Other types of electron emitting surfaces may be substituted for the ones generating the oscillating electron plasmas. Slots (not shown) are made in tubes 70 and 71 to create an exit path for the electrons and ions of the generated plasma. The electron emitting surfaces are powered by an alternating current, bipolar power supply (not shown). This creates an alternating, back and forth, electron flow through plasma path 72 and through magnetic mirror region 74. The alternating flow of electrons tends to spread and uniformly distribute the plasma when the apparatus is elongated. The inventor has surprisingly found that plasma lengths approaching four meters can retain uniform and stable plasma characteristics. Densified plasma region 74 is surprisingly uniform over these lengths and imparts a surprisingly large amount of energy to the surface of substrate 11. In the case of substrate 11 being, for example, a 3 mm thick glass monolith or glass ribbon, the temperature rises within a few seconds sufficient to cut the glass linearly along the line of the plasma. It is desirable to keep substrate 11 moving to avoid localized thermal damage, particularly if the substrate is a glass, a polymer or any other material that is subject to heat damage.

The region of densified plasma 74 is kept in contact with substrate 11 by having one or more magnetic poles 75 on the opposite side of the substrate from the electron emitting surfaces. One portion of the magnetic field passes from near the electron emitting surfaces, through the plasma area 72 then through the substrate 11 in region 77 to the pole behind the substrate. The other portion of magnetic circuit is comprised of the field flowing through pole pieces 78 and 79. These would typically be made of a magnetically conducting material, such as iron. Between pole piece parts 77 and 78 the magnetic field passes through substrate 11 into region 76.

Greater energy or energy spread over a larger area can be realized by increasing the number of magnetic poles behind substrate 11. Typically, to facilitate the magnetic circuit, an odd number of poles is maintained behind substrate 11. Many other configurations are possible if multiple pairs of electron emitting surfaces are incorporated as well as additional magnetic poles. These additional configurations will be recognized and appreciated by those of skill in the art in view of the disclosure herein.

Block 80 in FIG. 8 may correspond to a number of different hardware components. In its simplest form, it may be a wall enclosing the plasma space for purposes of pressure control, gas confinement, shielding or other mechanical uses. Block 80 may be an additional source of deposition atoms such as a sputtering source, an evaporation source or a gas manifold for distribution of a precursor gas. Such configurations will be recognized and appreciated by those of skill in the art in view of the disclosure herein.

The device of FIG. 8 is particularly advantageous if this densification of the plasma is in contact with a substrate surface and depositing atoms from deposition sources pass through the densified plasma region 74 prior to adhering to the substrate. If depositing atoms or molecules pass through the densified plasma region 74, the additional energy imparted to the depositing materials can result in desirable properties being imparted to the deposited layer. The advantageous properties imparted to the deposited layer may include, but are not limited to, enhanced barrier properties, layer density and enhanced crystallinity. Moreover, crystallization may also be accomplished or enhanced by post treatment and rapid annealing of an existing coating.

The device of FIG. 8 may also be effective at chemically modifying a surface by the plasma energy, by ion bombardment, or highly reactant gas species contained within the plasma. For the coating or surface treatment of large area substrates, the apparatus may be elongated to lengths of at least 2 to 3 meters. In FIG. 8, elongation would occur in the upward direction, or coming out of the plane of the paper.

Figure 9:
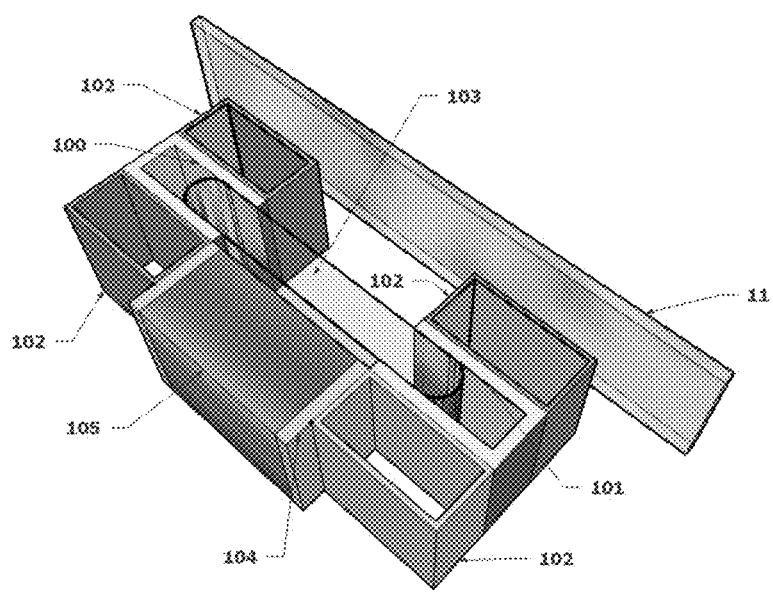
FIG. 9 shows a PECVD device in accordance with the present invention that comprises a third electrode.

FIG. 9 shows a PECVD source in accordance with the present invention that includes the addition of a third electrode. This third electrode may function to accelerate ions out of the plasma formed by the dual electron emitting surfaces by the application of an electrical voltage applied to this third electrode. This voltage is separate from the voltage applied to the electron emitting surfaces and may be non-changing positive or negative bias (direct current) or varied in some form of an alternating voltage. The alternating voltage may be continuously changing or pulsed. It may be synchronized to the voltage of the electron emitting surfaces. The proper voltage requirements will be determined by the desired application of the PECVD source of FIG. 9, as will be recognized and appreciated by those of skill in the art in view of the disclosure herein. The third electrode may be configured with magnetic fields to confine or steer electrons in some specific manner. Other combinations of equipment and positioning of the third electrode will be recognized and appreciated by those of skill in the art.

In FIG. 9, the plasma is formed by first electron emitting surface 100 and by second electron emitting surface 101. The electron emitting surfaces 100 and 101 are of the electron oscillation type. They may be optionally water cooled by the four water cooling tubes 102. Plasma 103 is formed between and within the facing surfaces of each of the two electron emitting surfaces 100 and 101. Electrically conductive third electrode 105 is insulated from direct electrical contact with the electron emitting surfaces by insulators 104 on either end. A uniquely long yet very compact, in width and height, beam of ions may be accelerated towards or away from electrode 105.

A practical application of the PECVD source of FIG. 9 may be made by connecting third electrode 105 to a power supply capable of high current, high voltage negative pulses. When pulsed in this manner, positive ions are accelerated towards the surface of third electrode 105 resulting in sputtering, or erosion by ion bombardment, of this surface. The sputtered atoms are primarily directed outward from the electrode surface to form a coating on substrate surface 11. Coating by this method allows deposition of materials typically difficult to do by magnetron sputtering, such as magnetic materials. The plasma 103 is an unusually effective source of ions for this application due to its density and high plasma current. The potential length of this sputtering method is not effectively available by other hardware. For the coating or surface treatment of large area substrates, the apparatus may be elongated to lengths of at least 2 to 3 meters. In FIG. 9, elongation would occur in the upward direction, or coming out of the plane of the paper.

The PECVD source of FIG. 9 may also have application as an ion bombardment source. Biasing of third electrode 105 positively either by a steady (direct current) or alternating voltage, ions may be accelerated towards the substrate.

Figure 10:
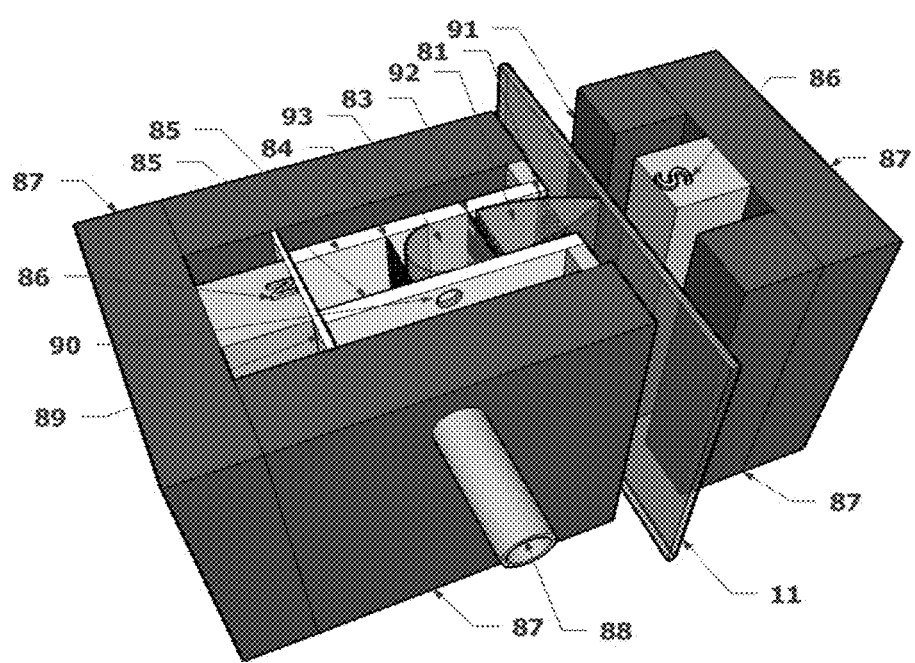
FIG. 10 shows a PECVD device in accordance with the present invention that comprises a series of porous walls.

FIG. 10 shows another embodiment of a PECVD source in accordance with the present invention. FIG. 10 shows a dual hollow cathode design wherein the facing electron emitting surfaces 81, 82, 83, and 84 forming two regions of electron oscillation 92 and 93 with a plasma current between them comprise porous conductive materials. Surprisingly, the electron oscillation effect is maintained when facing electron emitting surfaces 81, 82, 83, and 84 do not consist of a solid conductive wall. Surfaces 81, 82, 83, and 84 may comprise wire screen structures, sintered porous metal, drilled plates or any conductive material allowing a throughput of gas or plasma constituents. In some cases, it is advantageous for the pores of the porous electron emitting surfaces to provide a straight through path for accelerated particles, such as ions, to pass through without colliding with a solid. The porosity of the electron emitting surfaces may be as much as much as about 75% to as little as about 0.1%. A preferred range is about 50% to about 1%. Pores may comprise a variety shapes including, but not limited to, slots, square or round holes. The electron emitting surfaces may be made from a conductive foam or sintered material.

Gas entry into the plasma region may be configured in many ways. In FIG. 10, operating gas is injected through tube 88 then through a hole 90 in electrically insulating wall 85. Spacing of the insulating walls 85 may be spaced from about 2 mm apart to about 1 meter apart. Surprisingly, the plasma spreads out uniformly regardless of the spacing. If the source is elongated (upward in the orientation of FIG. 10), it may be made from about 10 mm to about 4 meters in length. The plasma spreads uniformly throughout this length and a large two dimensional plane of plasma may be made, if desired.

In FIG. 10, optional magnets 86 with accompanying pole pieces 87 are shown. In this configuration, plasma 92 and 93 is concentrated on substrate 11 by converging field lines of the magnet positioned on the opposite side of substrate 11 from the plasma forming apparatus. Magnetic field lines pass through the substrate in the region where plasma 92 contacts the surface and in region 91 through the magnetically conducting pole pieces 87. Insulating wall 89 isolates the plasma region from the magnet.

Figure 11:
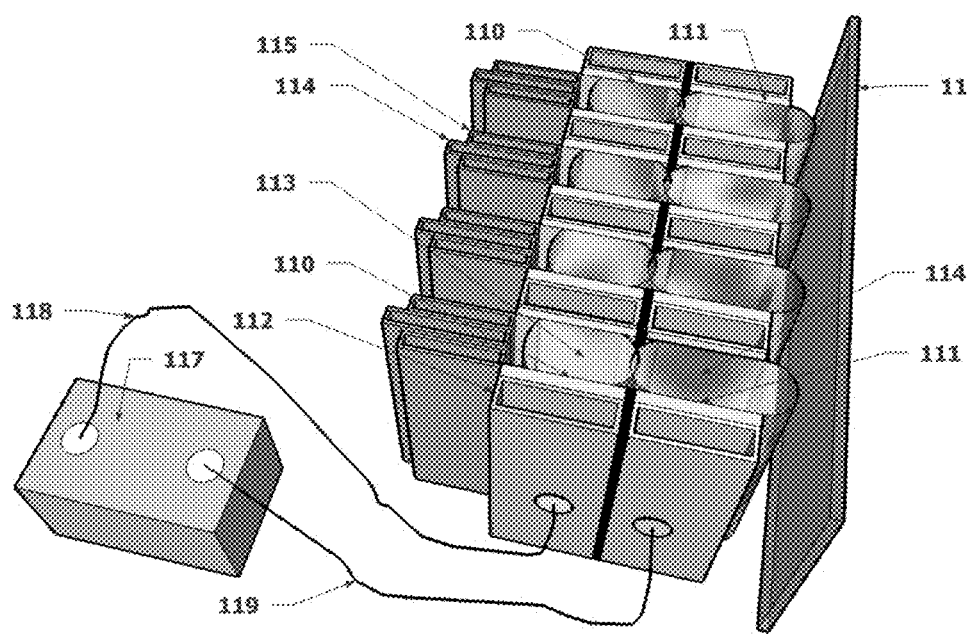
FIG. 11 shows an "in-line" PECVD device in accordance with the present invention

FIG. 11 shows a PECVD source in accordance with the present invention. FIG. 11 shows the electron emitting surfaces of FIG. 6 repeated into an array. In this configuration, the oscillating electron plasma forming pair of facing surfaces 110 and 111 is duplicated in a row. The number of electron emitting pairs may be from one, as in FIG. 6, to tens of pairs. All may be electrically connected to one bipolar power supply 117 through two wires 118 and 119. The entire row of facing electron surfaces 111 closest to the substrate 11 may be electrically connected together by wire 119 to generate plasma 114. The entire row of facing electron emitting surfaces 110 may be electrically connected together by an alternating voltage out of phase with row 111 through another wire 118 to generate plasma 113. Surprisingly, despite being driven by one power supply, the plasma is uniformly distributed in the width direction across all pairs of the array. When the source is elongated to as long a 4 meters, the plasma is also uniform in length.

The precursor gases and reactive gases may be distributed through separate gas manifolds 114 and 115. Preferably, the precursor gas is injected through the center manifold 114. The reactive gas is preferably injected through manifolds 115 in a manner which flows the reactive gas along the electron emitting surfaces 110 and 111 to reduce coating of these surfaces. Optionally, electron emitting surfaces 110 and 111 may be cooled through water cooling channels 112.

The array of FIG. 11 may be used to deposit coating materials on substrate 11 at extremely high deposition rates when one precursor is used. Deposition rates may be achieved which are presently beyond the capability of conventional PECVD devices, about 0.5 µm/second. The apparatus may also be operated with different precursor gases injected into different electron emitting surface pairs to create a multilayer coating stack. The capability to create a multilayer stack from one device which may be as narrow as 50 mm and yet up to 4 meters long is also not available using conventional PECVD coating technology.

EXAMPLE 1

A silicon dioxide coating made from the PECVD device of FIG. 5 is described below. The PECVD device has a total length of about 150 mm and a width of about 50 mm. The distance from the bottom of the hollow cathode electrodes to a top surface of a glass substrate was fixed at 11 mm. A total of four hollow cathodes were disposed adjacently and connected to an AC power source. Precursor gas was supplied to dark space 33 via feed tubes 36 and was supplied at a rate of 100 sccm. The precursor gas was 100% tetramethyldisiloxane. Reactant gas was supplied to the hollow cathode space via feed tubes 35. The reactant gas was 100% oxygen and was supplied at a rate of 300 sccm. Substrate 11 was a piece of soda-lime float glass and was held stationary under the PECVD source of FIG. 5. The AC power supply source used was an Advanced Energy PE-II, 40 kHz AC power supply source. The size of the coated area on substrate 11 was 50 mm×100 mm. Results of the coating process are given in Table 1.

TABLE 1

Deposition parameters for the thin film coating described in Example 1.

| Voltage (volts) | Current (amps) | Power (watts) | Coating time (seconds) | Thickness (microns) |
|---|---|---|---|---|
| 354 | 8.4 | 3000 | 10 | 6.0 |

As can be seen from Table 1, a thin film coating of silicon dioxide was deposited on a stationary glass substrate for 10 seconds to produce a silicon dioxide thin film that is 6 microns thick. This works out to a deposition rate of 0.6 µm/second. No other PECVD device of which the inventor is currently aware of is capable of such high deposition rates. The optical properties of the silicon dioxide film were qualitatively inspected with an optical microscope to show the coating had a high degree of smoothness and a low degree of haze. Also, tensile stress was qualitatively evaluated by separating the silicon dioxide coating from the substrate and observing any "curling" of the coating. If significant tensile stress was present in the coating, it would be expected to curl. However, no curling was observed, and thus, the silicon dioxide coating of Example 1 was deemed to have low tensile stress.

While the present invention has been described with respect to specific embodiments, it is not confined to the specific details set forth, but includes various changes and modifications that may suggest themselves to those skilled in the art, all falling within the scope of the invention as defined by the following claims.

What is claimed is:

1. A method of forming a coating using plasma enhanced chemical vapor deposition (PECVD), comprising:
   a) providing a plasma source comprising a first hollow cathode and a second hollow cathode disposed adjacently and separated by a space;
   b) producing, with the plasma source, a plasma that is linear and that is made substantially uniform over its length in the substantial absence of Hall current;
   c) providing a substrate with at least one surface to be coated proximate to the plasma;
   d) flowing a precursor gas through the space;
   e) energizing, partially decomposing, or fully decomposing the precursor gas by contacting the plasma with the precursor gas; and
   f) depositing the coating on the at least one surface of the substrate using PECVD;
   wherein the depositing includes one of bonding and condensing a chemical fragment of the precursor gas containing a desired chemical element for coating on the at least one surface of the substrate.

2. The method of claim 1, wherein the space separating the first hollow cathode and the second hollow cathode comprises a dark space.

3. The method of claim 2, wherein the precursor gas is not energized, partially decomposed, or fully decomposed in the dark space.

4. The method of claim 2, wherein the energizing, partially decomposing, or fully decomposing of the precursor gas is proximate to the substrate.

5. The method of claim 2, wherein the precursor gas flows through the dark space towards the substrate.

6. The method of claim 1, wherein a reactant gas is provided directly into a region of electron oscillation within at least one of the first hollow cathode and the second hollow cathode.

7. The method of claim 6, wherein the reactant gas is an electrically conductive gas.

8. The method of claim 1, wherein the first hollow cathode and the second hollow cathode each comprise two facing surfaces at the same electric potential, and wherein a reactant gas flows along the two facing surfaces of the first hollow cathode and the second hollow cathode.

9. The method of claim 1, wherein each of the first hollow cathode and the second hollow cathode is comprised of a porous material, and
   further wherein a reactant gas is provided through the pores of the porous material.

10. The method of claim 1, wherein the precursor gas is provided through a manifold or tube.

11. The method of claim 1, wherein a mixture comprising the precursor gas and a reactant gas is provided into the space separating the first hollow cathode and the second hollow cathode.

12. The method of claim 1, wherein the method is performed at a pressure from about atmospheric pressure to about $10^{-4}$ millibar.

13. The method of claim 1, wherein the method is performed at a pressure from about 1 millibar to about $10^{-3}$ millibar.

14. A method of forming a coating using plasma enhanced chemical vapor deposition (PECVD), comprising:
   a) providing a plasma source comprising a first hollow cathode and a second hollow cathode disposed adjacently and separated by a space;
   b) producing, with the plasma source, a plasma that is linear and that is made substantially uniform over its length in the substantial absence of Hall current;
   c) providing a substrate with at least one surface to be coated proximate to the plasma;
   d) flowing a precursor gas through the space;
   e) energizing, partially decomposing, or fully decomposing the precursor gas by contacting the plasma with the precursor gas; wherein the energizing, partially decomposing, or fully decomposing the precursor gas forms condensable molecular entities which adhere to the at least one surface of the substrate.

15. The method of claim 14, wherein the space separating the first hollow cathode and the second hollow cathode comprises a dark space.

16. The method of claim 15, wherein the precursor gas is not energized, partially decomposed, or fully decomposed in the dark space.

17. The method of claim 15, wherein the energizing, partially decomposing, or fully decomposing of the precursor gas is proximate to the substrate.

18. The method of claim 15, wherein the precursor gas flows through the dark space towards the substrate.

19. The method of claim 14, wherein a reactant gas is provided directly into a region of electron oscillation within at least one of the first hollow cathode and the second hollow cathode.

20. The method of claim 19, wherein the reactant gas is an electrically conductive gas.

21. The method of claim 14, wherein the first hollow cathode and the second hollow cathode each comprise two facing surfaces at the same electric potential, and wherein a reactant gas flows along the facing surfaces of the first hollow cathode and the second hollow cathode.

22. The method of claim 14, wherein each of the first hollow cathode and the second hollow cathode is comprised of a porous material, and
   further wherein a reactant gas is provided through the pores of the porous material.

23. The method of claim 14, wherein the precursor gas is provided through a manifold or tube.

24. The method of claim 14, wherein a mixture comprising the precursor gas and a reactant gas is provided into the space separating the first hollow cathode and the second hollow cathode.

25. The method of claim 14, wherein the method is performed at a pressure from about atmospheric pressure to about $10^{-4}$ millibar.

26. The method of claim 14, wherein the method is performed at a pressure from about 1 millibar to about $10^{-3}$ millibar.

* * * * *